(12) United States Patent
Iguchi et al.

(10) Patent No.: US 11,069,779 B2
(45) Date of Patent: Jul. 20, 2021

(54) SILICON CARBIDE SEMICONDUCTOR DEVICE AND METHOD FOR MANUFACTURING THE SAME

(71) Applicant: FUJI ELECTRIC CO., LTD., Kawasaki (JP)

(72) Inventors: Kenichi Iguchi, Matsumoto (JP); Haruo Nakazawa, Matsumoto (JP); Yusuke Wada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/362,077

(22) Filed: Mar. 22, 2019

(65) Prior Publication Data
US 2019/0371893 A1 Dec. 5, 2019

(30) Foreign Application Priority Data
May 29, 2018 (JP) .................................. 2018-102560

(51) Int. Cl.
| | |
|---|---|
| *H01L 29/16* | (2006.01) |
| *H01L 29/45* | (2006.01) |
| *H01L 29/36* | (2006.01) |
| *H01L 29/04* | (2006.01) |
| *H01L 21/285* | (2006.01) |
| *H01L 21/02* | (2006.01) |
| *H01L 21/265* | (2006.01) |
| *H01L 21/268* | (2006.01) |

(52) U.S. Cl.
CPC .... *H01L 29/1608* (2013.01); *H01L 21/02378* (2013.01); *H01L 21/02529* (2013.01); *H01L 21/2686* (2013.01); *H01L 21/26513* (2013.01); *H01L 21/28518* (2013.01); *H01L 29/04* (2013.01); *H01L 29/36* (2013.01); *H01L 29/45* (2013.01)

(58) Field of Classification Search
CPC ..... H01L 29/1608; H01L 29/04; H01L 29/36; H01L 29/45; H01L 21/02378; H01L 21/02529; H01L 21/26513; H01L 21/2686; H01L 21/28518
See application file for complete search history.

(56) References Cited

U.S. PATENT DOCUMENTS

| | | | |
|---|---|---|---|
| 6,803,243 | B2 | 10/2004 | Slater, Jr. et al. |
| 6,884,644 | B1 | 4/2005 | Slater, Jr. et al. |

(Continued)

FOREIGN PATENT DOCUMENTS

| | | |
|---|---|---|
| JP | 2010-205824 A | 9/2010 |
| JP | 4660733 B2 | 3/2011 |

(Continued)

*Primary Examiner* — Shaun M Campbell

(57) ABSTRACT

A silicon carbide semiconductor device includes a first semiconductor layer of silicon carbide, a device structure provided on top of the first semiconductor layer, a second semiconductor layer of silicon carbide having a higher impurity concentration than the first semiconductor layer, provided under the first semiconductor layer, the second semiconductor layer implementing an ohmic-contact, and a metallic electrode film provided under the second semiconductor layer. A thickness of a carbon-containing region in which carbon-atoms are precipitated between the second semiconductor layer and the metallic electrode film is 10 nm or less.

19 Claims, 15 Drawing Sheets

(56) References Cited

U.S. PATENT DOCUMENTS

| | | |
|---|---|---|
| 6,909,119 B2 | 6/2005 | Slater, Jr. et al. |
| 2002/0179910 A1 | 12/2002 | Slater, Jr. |
| 2004/0171204 A1 | 9/2004 | Slater, Jr. et al. |
| 2011/0233560 A1* | 9/2011 | Koike .................. H01L 29/47 257/77 |
| 2012/0119225 A1 | 5/2012 | Shiomi et al. |
| 2012/0126250 A1* | 5/2012 | Tamaso ................ H01L 29/45 257/77 |
| 2015/0024581 A1* | 1/2015 | Imai ................ H01L 21/28537 438/571 |
| 2016/0189982 A1* | 6/2016 | Iguchi ............... H01L 29/1608 438/118 |
| 2016/0254393 A1* | 9/2016 | Ohse .................... H01L 29/47 257/77 |
| 2017/0162390 A1* | 6/2017 | Rupp ................ H01L 21/0485 |
| 2019/0164817 A1* | 5/2019 | Khaderbad ..... H01L 21/823431 |

FOREIGN PATENT DOCUMENTS

| | | |
|---|---|---|
| JP | 2016-51737 A | 4/2016 |
| JP | 6053968 B2 | 12/2016 |
| WO | 2011/155234 A1 | 12/2011 |

\* cited by examiner

SILICON CARBIDE SEMICONDUCTOR DEVICE AND METHOD FOR MANUFACTURING THE SAME

CROSS REFERENCE TO RELATED APPLICATIONS

This application is based upon and claims the benefit of priority from the prior Japanese Patent Application No. P2018-102560 filed on May 29, 2018, the entire contents of which are incorporated herein by reference.

BACKGROUND OF THE INVENTION

1. Field of the Invention

The present invention relates to a silicon carbide (SiC) semiconductor device and a method for manufacturing the same.

2. Description of the Related Art

In a vertical power semiconductor device in which a main current flows between electrodes on an upper surface and a lower surface of a semiconductor substrate, for example, in a MOS device, the current in an ON state flows through the electrode on the upper surface-side, a channel region, a drift layer and the electrode on the lower face-side, and a loss depending on an electric resistance occurs. For example, WO 2011/155234 A discloses a technique for decreasing on-resistance by a structure including a base region having a higher impurity concentration than an epitaxial growth layer provided on an upper surface in a vertical semiconductor device.

On the other hand, a wide band gap semiconductor, particularly a silicon carbide (SiC) crystal is expected as a material for the power semiconductor device. Although the SiC crystal has various polymorphs, in especial, 4H—SiC is used because of excellent physical properties. For example, in JP 2016-051737 A, a laser doping technique in which a SiC semiconductor substrate is immersed in molecules of an impurity element in a liquid phase, and an upper surface of the immersed semiconductor substrate is irradiated with a laser light to introduce impurities to form a desired semiconductor region, is disclosed.

In manufacturing processes of the vertical power device using SiC, ordinarily, a device structure, such as a diode, a MOSFET or the like, is formed on the upper surface-side of the SiC semiconductor substrate. In the fabrication of the device structure, for example, an epitaxial growth layer, or epi-layer, having a desired impurity concentration is grown on a substrate, and implantation of impurity ions into the epi-layer and activation annealing of the implanted ions is executed. By repeating ion implantation and activation annealing, a p-type region or an n-type region serving as a device structure is formed. A metallic layer or the like is deposited on the p-type region and the n-type region as an electrode, and other metallic layer or the like is deposited also on the lower surface-side of the substrate as an electrode.

For example, JP 4660733 B discloses a fabrication method of the lower surface-side ohmic-contact, which includes a step of implanting phosphorus (P) ions as the impurity, a step of activating the implanted impurity and a step of depositing the metallic layer. Here, there is a problem that formation of a practically effective ohmic-contact is difficult only by direct contact to the 4H—SiC because of a higher barrier with most metals. Consequently, various methods for forming a low resistance ohmic-contact and flowing a large current are being sought by lowering the barrier height between SiC and the metal.

For example, a method of forming a silicide layer as the ohmic-contact between a SiC semiconductor layer and a metallic layer is known. The silicide layer may be formed, for example, by depositing a metallic layer on a surface of the SiC semiconductor layer and annealing the deposited metallic layer at a high temperature so as to generate a metal-silicidation reaction (hereinafter simply referred to as a "silicidation reaction"). The crystalline state of SiC is actively disturbed by the silicidation reaction, and a large number of levels are formed in the barrier between SiC and the metal, whereby the resistance of the ohmic-contact may be decreased.

However, in the case of forming the silicide layer, since carbon (C) is contained as a constituent element in the SiC, excess C-atoms are precipitated in layers or in clusters on a surface and in an inside of the silicide layer and in the SiC by the reaction between silicon (Si) and the metal. It is difficult to completely avoid the precipitation of the excess C-atoms even in heating the entire semiconductor substrate such as furnace annealing or even in local heating processing such as laser light irradiation. Also, unless the precipitated region of the C-atoms is removed, it is difficult to remove the C-atoms precipitated in the silicide or in the SiC. JP 2010-205824 A discloses a technique in which a metallic thin film containing metallic atoms composing a carbide is formed on a lower surface of a SiC semiconductor device, and the metallic atoms in the metallic thin film and the C-atoms contained in the SiC are reacted to form a drain electrode including a carbide layer. JP 6053968 B describes that low resistance ohmic-contact may be achieved by utilizing C-aggregates precipitated in the ohmic-contact on the lower surface for energization.

However, if the excess C-atoms precipitate in a certain structure, such as in layers or in the clusters, on the surface and in the inside of the silicide layer and in the SiC, the excess C-atoms may serve as a starting point of delamination and problems, such as peeling, breakage and the like, of the ohmic-contact layer may occur. Even if the problems due to the precipitated C-atoms is not actualized at the time immediately after production of the semiconductor device, precipitation of the C-atoms continues to be accelerated due to energization during use of the semiconductor device or due to heat caused by the energization. Therefore, from a long-term viewpoint, in the semiconductor device containing a large amount of C-atoms in the ohmic-contact, the problems, such as peeling of electrodes and occurrence of voids, may arise, and there is a fear that the quality of the semiconductor device is largely deteriorated.

SUMMARY OF THE INVENTION

An aspect of the present invention inheres in a method for manufacturing a SiC semiconductor device, including: (a) a first semiconductor layer of silicon carbide; (b) a device structure provided on top of the first semiconductor layer; (c) a second semiconductor layer of silicon carbide having a higher impurity concentration than the first semiconductor layer, provided under the first semiconductor layer, the second semiconductor layer implementing an ohmic-contact; and (d) a metallic electrode film provided under the second semiconductor layer; wherein a thickness of a carbon-containing region in which carbon-atoms are precipitated between the second semiconductor layer and the metallic electrode film is 10 nm or less.

Another aspect of the present invention inheres in a SiC semiconductor device including: (a) growing a first semiconductor layer on a silicon carbide semiconductor substrate; (b) forming a device structure on top of the first semiconductor layer; (c) thinning the semiconductor substrate; (d) implanting ions of an impurity element to a lower surface of the semiconductor substrate exposed by thinning; (e) activating the ions so as to form a second semiconductor layer of silicon carbide having a higher impurity concentration than the first semiconductor layer, the second semiconductor layer implementing an ohmic-contact; and (f) forming a metallic electrode film on a lower surface of the second semiconductor layer; wherein a thickness of a carbon-containing region in which carbon-atoms are precipitated between the second semiconductor layer and the metal electrode film, is 10 nm or less.

DETAILED DESCRIPTION

Figure 1:
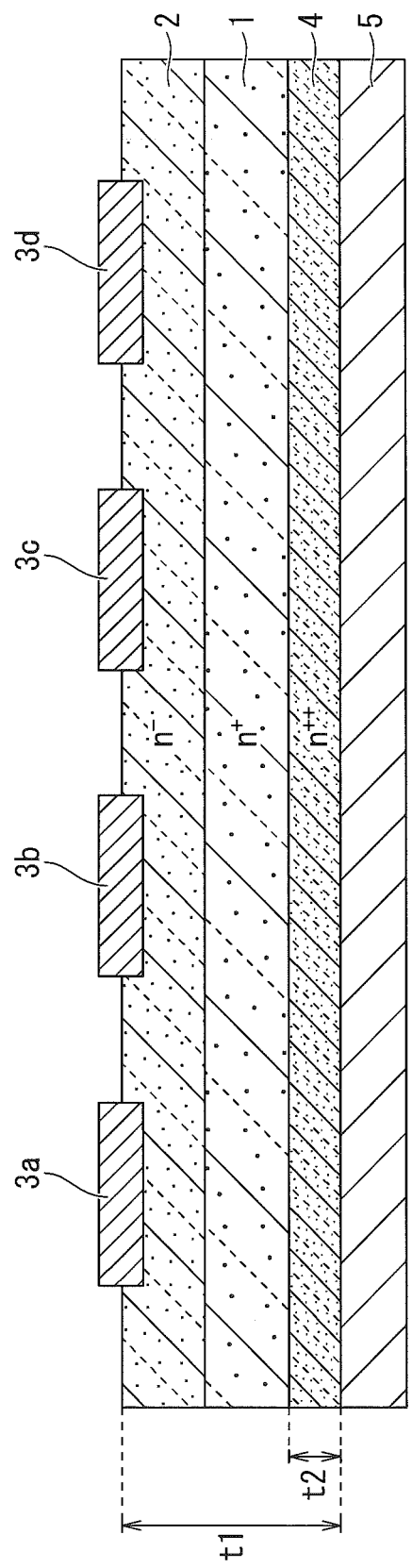
FIG. 1 is a schematic cross-sectional view illustrating a configuration of a SiC semiconductor device according to a first embodiment of the present invention.

First to third embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

Further, in the following description, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "left" is changed to the "right", and the "right" is changed to the "left". Further, in the Specification and the appended drawings, regions or layers denoted by the mark "n" or "p" denote that electrons or holes are majority carriers, respectively.

In addition, the superscript "+" or "−" added to the mark "n" or "p" denotes that a semiconductor region has a higher or lower impurity concentration than a region without the superscript "+" or "−" added. It should be noted that semiconductor regions denoted by the same mark, such as "p", do not necessarily have exactly the same impurity concentration.

First Embodiment

<Semiconductor Device>

An SiC semiconductor device according to a first embodiment is a thin vertical power semiconductor device in which a Schottky barrier diode, or an SBD, is provided as a device structure. As illustrated in FIG. 1, the SiC semiconductor device according to the first embodiment includes an $n^+$-type semiconductor substrate 1 of SiC and an $n^-$-type first semiconductor layer 2 of SiC provided on the semiconductor substrate 1 and having a lower impurity concentration than the semiconductor substrate 1. Device structures 3a, 3b, 3c, 3d are provided on the first semiconductor layer 2.

Under the first semiconductor layer 2, an $n^{++}$-type second semiconductor layer 4 of SiC, which has a higher impurity concentration than the first semiconductor layer 2 and the semiconductor substrate 1, is joined to the lower surface of the semiconductor substrate 1. A thickness t1 between an upper surface of the first semiconductor layer 2 and a lower surface of the second semiconductor layer 4 is 50 μm or less. A metallic electrode film 5 is in contact with the lower surface of the second semiconductor layer 4. A junction between the metallic electrode film 5 and the second semiconductor layer 4 implements an ohmic-contact in the first embodiment. The metallic electrode film 5 may be made of nickel (Ni), aluminum (Al), NiAl or the like.

In the SiC semiconductor device illustrated in FIG. 1, the upper surface of the first semiconductor layer 2 serves as a top surface and the lower surface of the second semiconductor layer 4 serves as a back surface. The device structures 3a to 3d are provided on the top surface-side. The device structures 3a to 3d illustrated in FIG. 1 are schematic illustrations, and detailed illustrations of specific device structures as an actual semiconductor device are omitted. As the specific device structures, for example, in the case of the SBD, a Schottky electrode and a peripheral breakdown-voltage structure may be provided. In addition, in the case of a MOS transistor, semiconductor regions, such as a channel region, a source region and the like, on the first semiconductor layer 2 and gate electrodes on the semiconductor regions via an insulating film may be provided as the specific device structures.

In the SiC semiconductor device according to the first embodiment, the impurity concentration of the second semiconductor layer 4 is set to be as high as about $3\times10^{19}$ cm$^{-3}$ and the thickness t2 of the second semiconductor layer 4 is set to be almost uniform in a range of 0.05 μm or more and 0.5 μm or less. As just described, by controlling the impurity concentration and the thickness t2 of the second semiconductor layer 4, in the first embodiment, the amount of C-atoms formed by the silicidation reaction between the second semiconductor layer 4 and the metallic electrode film 5 which are in contact with each other, is suppressed.

The amount of C-atoms can be evaluated, for example, by a thickness of a "carbon region" which occurs in the ohmic-contact. As same as the thickness of the semiconductor device in the cross-sectional view as illustrated in FIG. 1, the thickness of the "carbon region" is provided by measuring a length of the carbon region where the C-atoms reside, in a vertical direction, and it can be evaluated that the thinner the thickness of the carbon region, the less the amount of precipitated C-atoms. In the SiC semiconductor device according to the first embodiment, the thickness of the carbon region is controlled to 10 nm or less. In addition, in the SiC semiconductor device illustrated in FIG. 1, a case where almost no C-atoms are precipitated in a region between the second semiconductor layer 4 and the metallic electrode film 5 is illustrated.

In the SiC semiconductor device according to the first embodiment, the thickness t2 of the second semiconductor layer 4 having the higher impurity concentration is intentionally thinned to be 0.05 μm or more and 0.5 μm or less, and a thickness of a carbon-containing region where carbon-atoms are precipitated in the ohmic-contact, is controlled to be 10 nm or less. Therefore, it is possible to achieve a high quality SiC semiconductor device in which precipitation of the carbon-atoms is largely prevented.

Further, in the vertical power semiconductor device, it is possible to reduce the resistance component of the conduction region by thinning the semiconductor device. In particular, in the power semiconductor device using 4H—SiC, the breakdown electric field strength is as high as 2.8 MV/cm which is about 10 times as large as that of a power semiconductor device using Si. Therefore, in the SiC power semiconductor device, even though achieving the same degree of withstand voltage as in the Si, the required thickness can be suppressed to about 1/10 of that of Si power semiconductor device, then, even in a semiconductor device having a withstand voltage of about 1200 V, for example, a required thickness is only about 10 μm. Thus, in the SiC semiconductor device according to the first embodiment, the thickness t1 between the upper surface of the first semiconductor layer 2 and the lower surface of the second semiconductor layer 4, which functions as a conduction region, is decreased to 50 μm or less, thereby the ON resistance can be further decreased.

<Manufacturing Method of Semiconductor Device>

Figure 2:
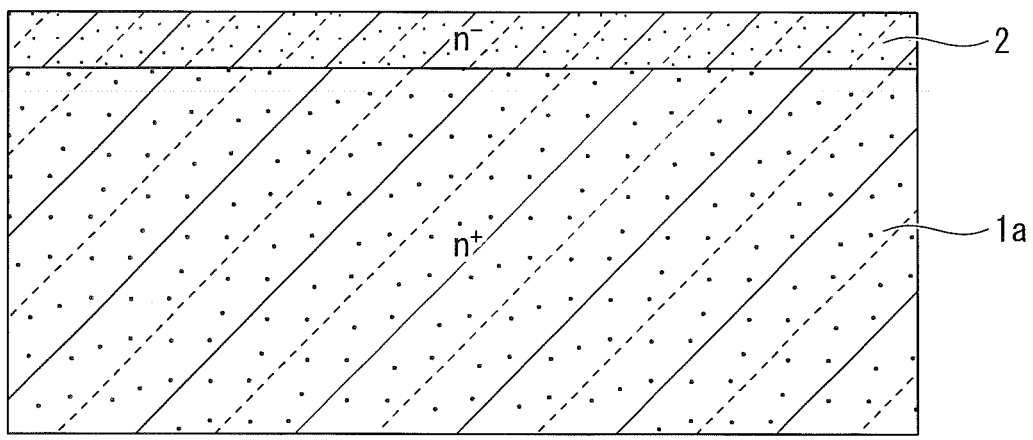
FIG. 2 is a schematic cross-sectional view illustrating a method for manufacturing the SiC semiconductor device according to the first embodiment (part 1)

Next, a manufacturing method of manufacturing the SiC semiconductor device according to the first embodiment will be described. First, as illustrated in FIG. 2, an $n^+$-type semiconductor substrate 1a having a main material of 4H—SiC is prepared. The semiconductor substrate 1a is, for example, a semiconductor wafer including a bulk SiC layer having an impurity concentration of about $1\times10^{18}$ cm$^{-3}$ and a thickness of about 350 μm. An SiC layer is epitaxially grown on the semiconductor substrate 1a to form an $n^-$-type epitaxial layer having a thickness of about 10 μm as a first semiconductor layer 2.

Figure 3:
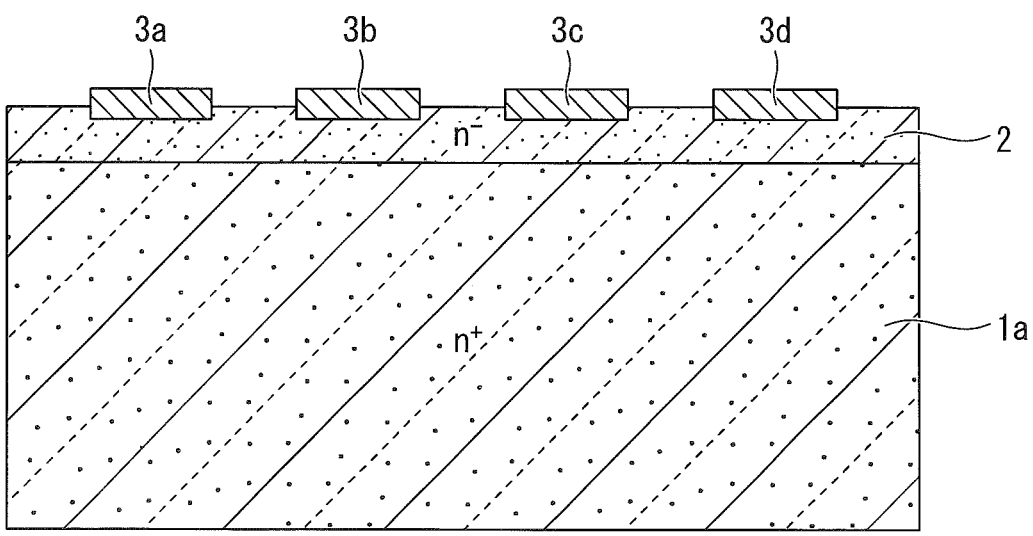
FIG. 3 is a schematic cross-sectional view illustrating the method for manufacturing the SiC semiconductor device according to the first embodiment (part 2)

Next, as illustrated in FIG. 3, device structures 3a, 3b, 3c, 3d, which implement a semiconductor chip, are formed on top of the first semiconductor layer 2. More specifically, an ion-implantation mask is delineated on the first semiconductor layer 2 using a photolithography technique, an etching technique and the like, and impurity ions having a desired conductivity type are implanted into the first semiconductor layer 2 via the ion-implantation mask by an ion implantation method. When each of the device structures 3a to 3d is the SBD, p-type impurity ions, such as Al ions and the like, are implanted into the n-type first semiconductor layer 2. Then, by activation annealing, the implanted ions in the ion-implantation region is activated to form a peripheral breakdown-voltage structure. Thus, semiconductor regions serving as the device structures 3a to 3d are formed.

Then, a titanium (Ti) layer, for example, for Schottky electrodes on the top surfaces of the device structures 3a to 3d is deposited on the upper surface of the first semiconductor layer 2, and the Ti layer is delineated to form Ti electrode patterns. Then, for example, an Al film is deposited on the Ti electrode patterns to be patterned into a predetermined shape, and thus top surface electrodes are fabricated.

Figure 4:
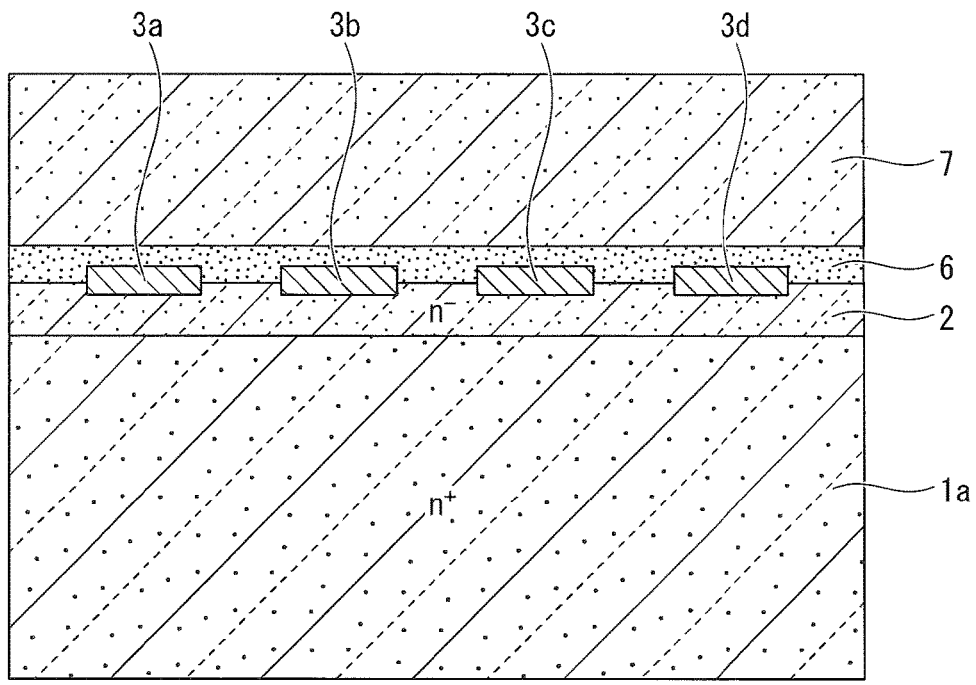
FIG. 4 is a schematic cross-sectional view illustrating the method for manufacturing the SiC semiconductor device according to the first embodiment (part 3)

Next, as illustrated in FIG. 4, an adhesive 6 having a thickness of about 10 μm, for example, is applied on the upper surface of the first semiconductor layer 2, and a support plate 7 having a thickness of about 1 mm is pasted through the adhesive 6 so as to enhance the strength of the SiC semiconductor device. That is, at the time of thinning, deformation, such as warping, swell and the like, may occur in the semiconductor device due to internal stress in the device structures 3a to 3d, or heat and pressure applied during processing, and the semiconductor device may be damaged. In particular, in the case of processing of the SiC semiconductor device to be thinned to an extremely thinner thickness of about 10 μm, problems, such as deformation and breakage, are noticeable. The support plate 7 may be made of, for example, a SiC substrate, a Si substrate, a glass substrate using Si as a raw material, or the like. For the adhesive 6, an organic adhesive, such as an epoxy-type, a silicone-type, an acrylic-type or the like, having a heatproof temperature of about 100° C. to 200° C. may be used.

Figure 5:
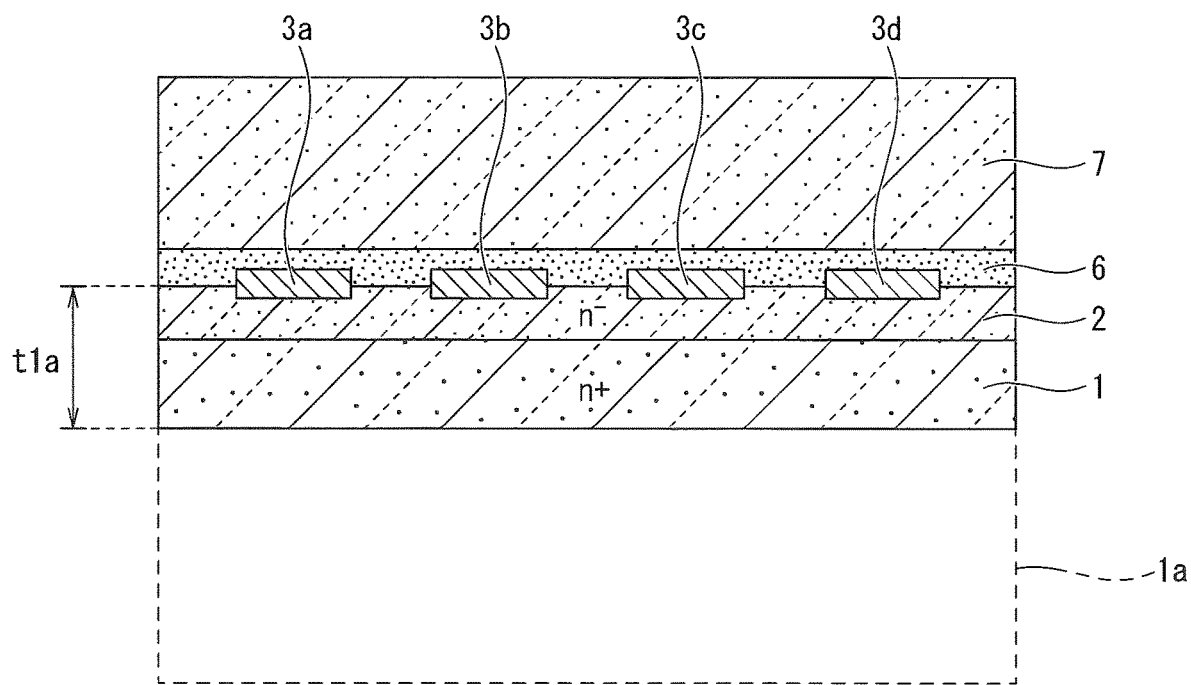
FIG. 5 is a schematic cross-sectional view illustrating the method for manufacturing the SiC semiconductor device according to the first embodiment (part 4)

Next, as illustrated in FIG. 5, the lower part of the SiC semiconductor device in which the strength is increased by the support plate 7 is thinned by a polishing technique such as chemical mechanical polishing (CMP) and the like. The thinning process is executed so that a thickness t1a between the upper surface of the first semiconductor layer 2 and the lower surface of the semiconductor substrate 1 which is the lower surface of the second semiconductor layer, is 50 μm or less. In FIG. 5, the semiconductor substrate 1 is thinned so as to partially leave the upper part of the semiconductor substrate 1a and the remaining region of the semiconductor substrate 1a is exemplified. When a damaged layer is formed in the lower part of the semiconductor substrate 1 by the thinning process, it is possible to remove the damaged layer by etching or the like.

In the polishing process, a region where the semiconductor substrate 1a partially remains is not essential. For example, when a thickness of a drift layer can be made thicker in compliance with the specification of the SiC semiconductor device to be manufactured, entire region of the semiconductor substrate 1a may be removed. In other words, in ion implantation to the back surface-side, which is scheduled to execute later, the lower surface of the SiC semiconductor device to be an implantation-region may be either the lower surface of the first semiconductor layer 2 which is an epitaxial layer, or the lower surface of the semiconductor substrate 1.

Figure 6:
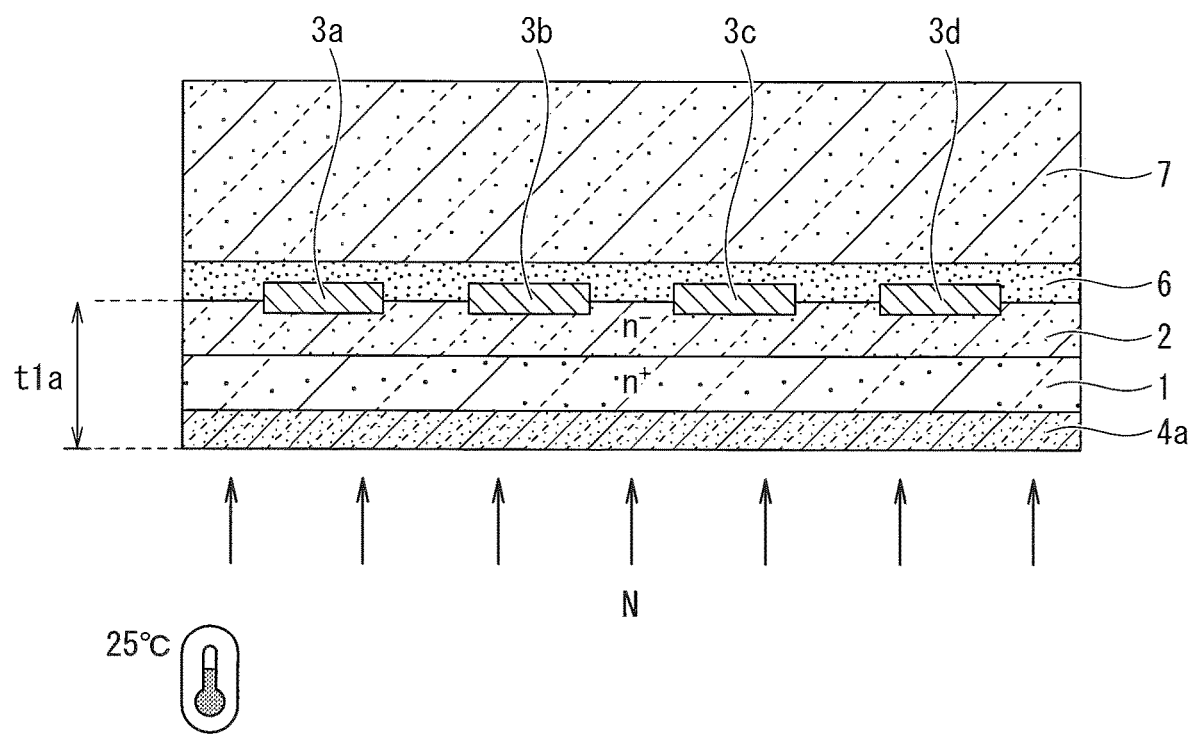
FIG. 6 is a schematic cross-sectional view illustrating the method for manufacturing the SiC semiconductor device according to the first embodiment (part 5)

Next, as illustrated in FIG. 6, a temperature of the SiC semiconductor device is adjusted to less than about 200° C. The temperature of the SiC semiconductor device can be controlled, for example, by adjusting a temperature of a stage on which the SiC semiconductor device is placed. In the case of the SiC semiconductor device illustrated in FIG. 6, the temperature of the SiC semiconductor device is adjusted to room temperature of about 25° C. Here, since the adhesive 6 used for bonding the support plate 7 is an organic adhesive having the heatproof temperature of about 100° C. to 200° C., when the temperature of the SiC semiconductor device is less than about 200° C., glass transition of the adhesive 6 may be prevented. Thus, while firmly securing the bonding by the adhesive 6, impurity ions are implanted as a dopant to the lower surface of the semiconductor substrate 1 which is thinned and exposed so as to form the ion-implantation region 4a.

Nitrogen (N) is preferable as an impurity element of the implanted ions employed as a dopant. In addition to N, P may be used as a dopant when forming an n-type semiconductor layer having a higher concentration than the semiconductor substrate in an n-type SiC semiconductor substrate. However, when the P ions are implanted with a high concentration in a low temperature process of about 200° C. to 400° C., the occurrence frequency of crystal defects due to implantation damage may be larger than in the case of N, and there is a concern that device characteristics, such as leakage current and the like, may be deteriorated. Therefore, in the first embodiment, N is more preferable from the viewpoint of maintenance of the device structures 3a to 3d and wide degree of freedom in the process that a material, such as a resin and the like, may be added to use as a structure. However, as far as process temperature permits, it does not exclude the use of P as a dopant.

In the ion-implantation, an acceleration voltage of implantation is suppressed so that ions are implanted into a region of relatively shallow depth in a range of about 0.05 μm to about 0.5 μm from the surface of SiC. When the depth of the ion-implantation region 4a is less than 0.05 μm, it is difficult to ensure the thickness required for ohmic-contact. When the depth exceeds 0.5 μm, the damage of SiC during implantation becomes larger.

Figure 7:
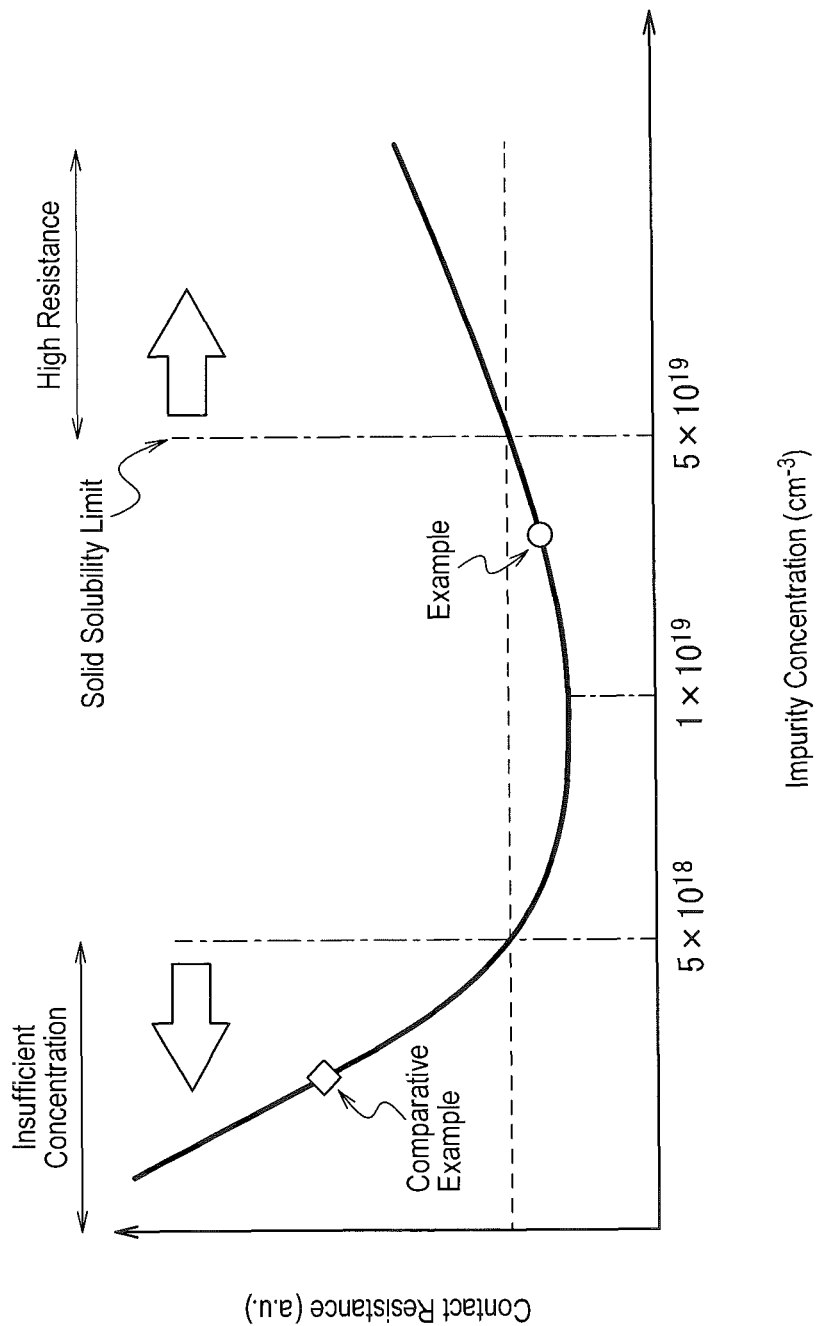
FIG. 7 is a graph schematically illustrating a relationship between an impurity concentration in the implantation region of impurities and a contact resistance.

As illustrated in FIG. 7, the impurity concentration of the semiconductor region formed by ion-implantation into SiC has a correlation with the contact resistance. FIG. 7 illustrates a curve of the relationship between the impurity concentration of the second semiconductor layer 4 and the ohmic-contact resistance. The contact resistance is indicated in arbitrary unit (au). The curve illustrating the relationship between the impurity concentration and the contact resistance exemplified in FIG. 7 is convex downward and has a bottom in a valley. In addition, FIG. 7 illustrates by an example in which N is used as the dopant, and even in the case of other dopants, it is also possible to apply as in the case with N in consideration of each solid solubility limit concentration.

As illustrated in FIG. 7, when the impurity concentration is less than about $5\times10^{18}$ cm$^{-3}$, the ohmic-contact resistance increases due to a large Schottky resistance component caused by insufficient impurity concentration. On the other hand, when the impurity concentration is in a range of about $5\times10^{18}$ cm$^{-3}$ or more and about $5\times10^{19}$ cm$^{-3}$ or less, a resistance value equal to or less than a certain value can be achieved as indicated by the horizontal broken line in FIG. 7. However, when the impurity concentration further increases beyond about $1\times10^{19}$ cm$^{-3}$ corresponding to the bottom value in the valley of the contact resistance and approaches about $5\times10^{19}$ cm$^{-3}$, which is the solid solubility limit concentration of N to 4H—SiC, the contact resistance conversely rises. When the impurity concentration exceeds about $5\times10^{19}$ cm$^{-3}$, the contact resistance value excessively increases. The reason why the value of the contact resistance inversely increases with the value at the valley bottom as a boundary, is that when the impurity concentration excessively increases, the crystal structure of SiC is distorted, and the implanted ions do not serve as the dopants in 4H—SiC.

In consideration of the correlation illustrated in FIG. 7, in the first embodiment, the impurity concentration of the implanted ions is controlled to about $5\times10^{18}$ cm$^{-3}$ or more and about $5\times10^{19}$ cm$^{-3}$ or less. Specifically, for example, the range of N ions is adjusted so that the ion-implantation concentration of N into the region from the surface to a depth of about 200 nm is in a uniform box-profile of about $3\times10^{19}$ cm$^{-3}$.

Figure 8:
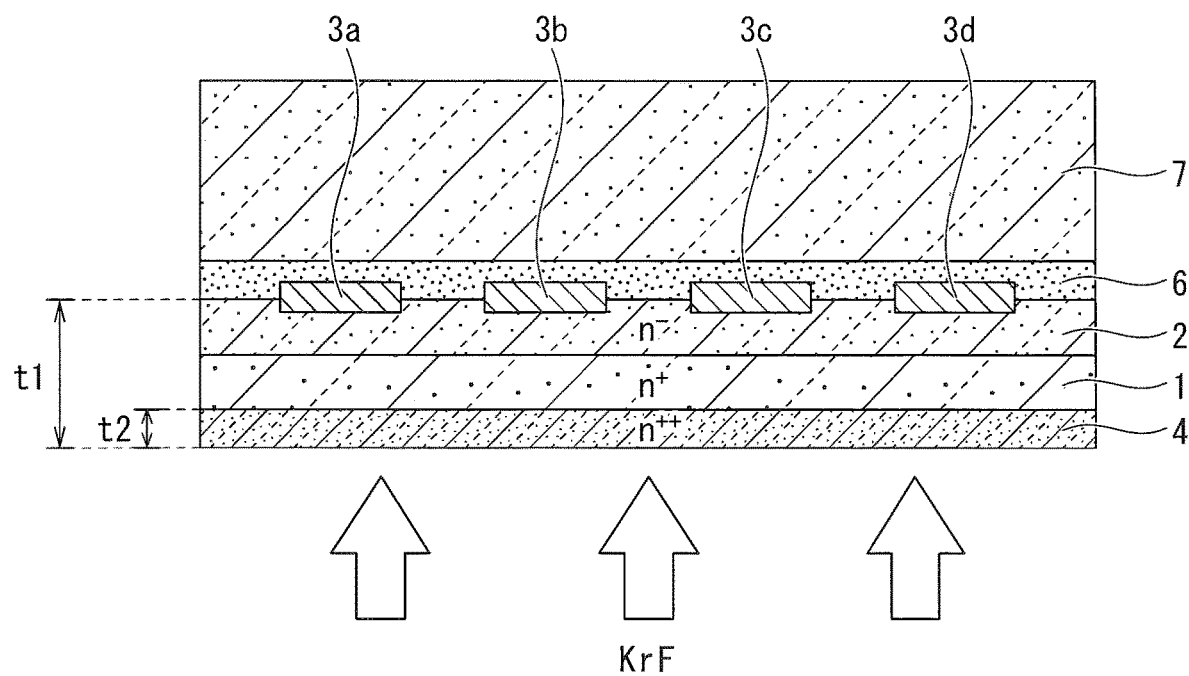
FIG. 8 is a schematic cross-sectional view illustrating the method for manufacturing the SiC semiconductor device according to a first embodiment (part 6)

Next, as illustrated in FIG. 8, the ion-implantation region 4a on the lower surface of the semiconductor substrate 1 as illustrated in FIG. 6 is subjected to activation laser annealing by irradiation with laser light. In the first embodiment, the wavelength of the laser light is set to about 190 nm or more and about 388 nm or less, for example, a KrF excimer laser having a wavelength of 248 nm, or the like can be suitably adopted.

Figure 9:
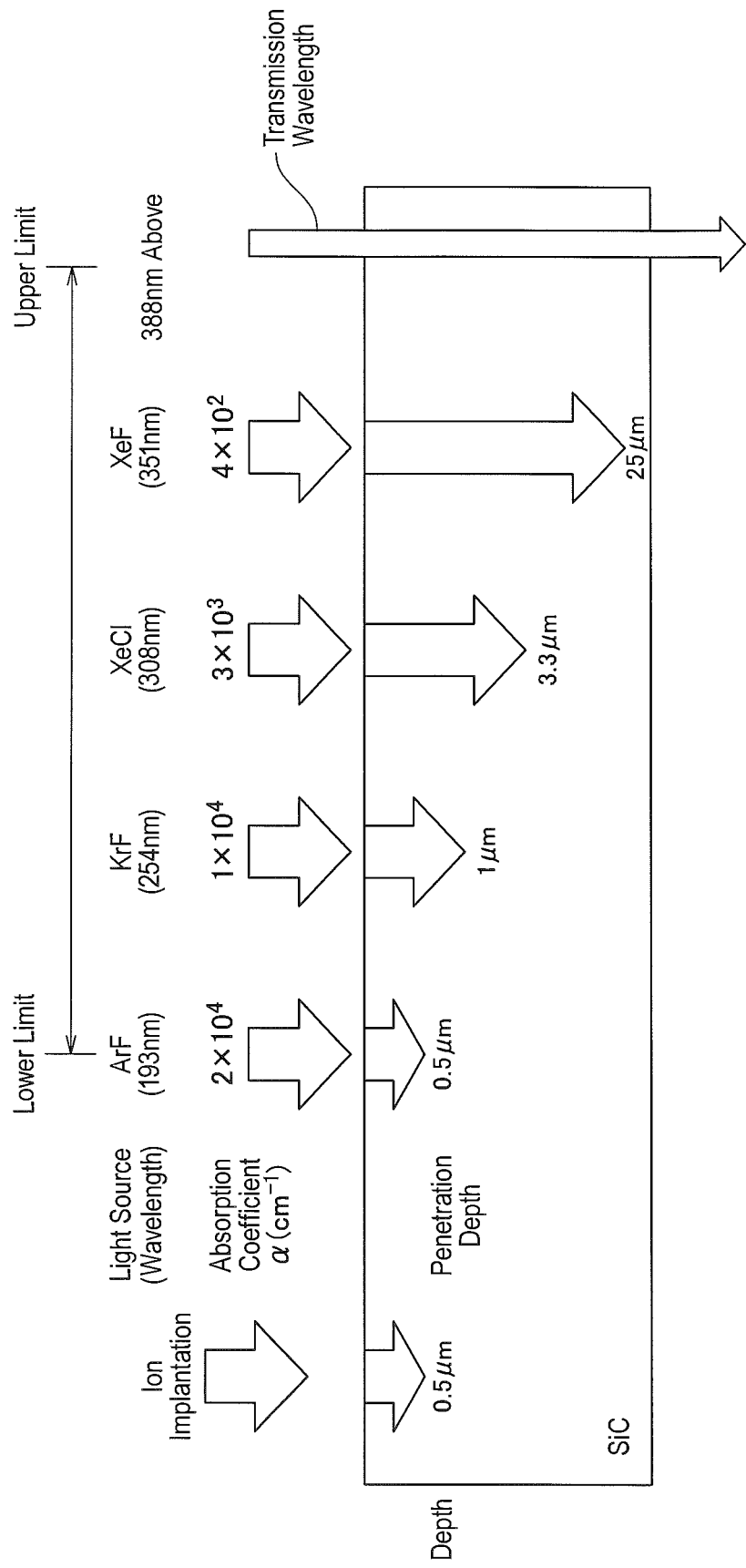
FIG. 9 is a graph schematically illustrating wavelengths of a plurality of laser lights used in laser annealing for SiC.

Here, the ion-implantation depth for SiC is about 0.5 μm or less. Therefore, as illustrated in FIG. 9, when the wavelength of the laser light is shorter than about 190 nm, the penetration depth of the laser light becomes shallower than the ion-implantation depth, and there is a concern that the entire ion-implantation region 4a may not be sufficiently activated. In addition, when the wavelength of the laser light is longer than about 388 nm, since the band gap of 4H—SiC is about 3.24 eV, the laser light transmits through the SiC, so that the substantial contribution to the activation of the implanted ions may be decreased.

By activating the ion-implantation region 4a by laser annealing, an n$^{++}$-type SiC second semiconductor layer 4 having a given thickness t2 may be formed. The thickness t2 of the second semiconductor layer 4 is controlled to 0.05 µm or more and 0.5 µm or less, so that an amount of carbon-atoms which will be precipitated between the second semiconductor layer 4 and a metallic electrode film 5 when the metallic electrode film 5 is bonded later, may be reduced. Although the carbon-atoms are precipitated also on the surface of SiC, since the carbon-atoms may be in an amorphous state, the carbon-atoms may be present on the surface of SiC. The amorphous carbon can be easily removed, such that the carbon-atoms may be removed by a known method such as sputtering technique with an inert gas.

Figure 10:
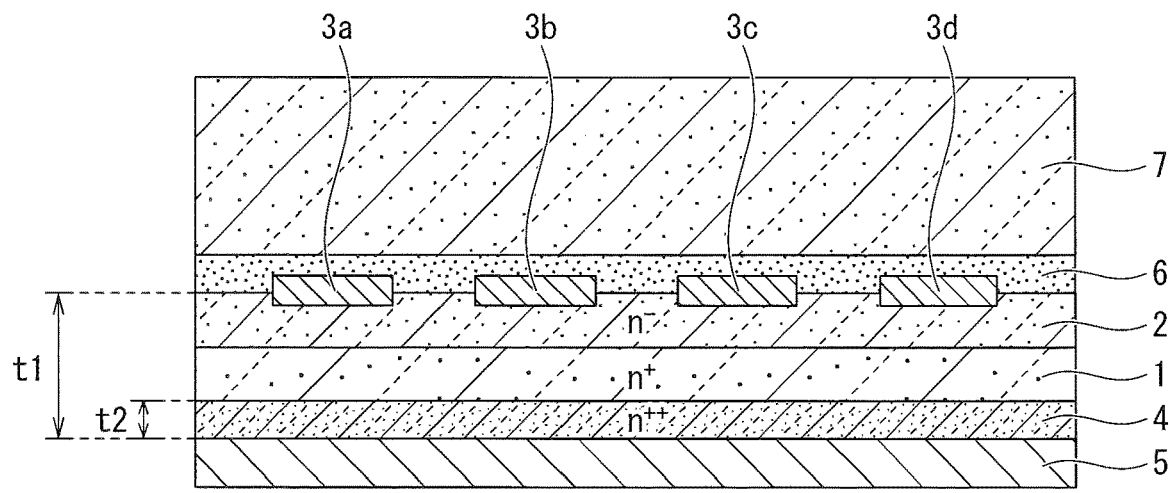
FIG. 10 is a schematic cross-sectional view illustrating the method for manufacturing the SiC semiconductor device according to a first embodiment (part 7)

Next, as illustrated in FIG. 10, a conductive film made of Ni, Al, NiAl or the like is deposited on the lower surface of the second semiconductor layer 4 by a sputtering technique, a vacuum-evaporation technique, or the like. Then, by delineating the conductive film into a predetermined shape by using a photolithography technique, an etching technique, and the like, the metallic electrode film 5, which is a back electrode, is formed as an ohmic electrode which has low contact resistivity between the metallic electrode film 5 and the second semiconductor layer 4.

Figure 11:
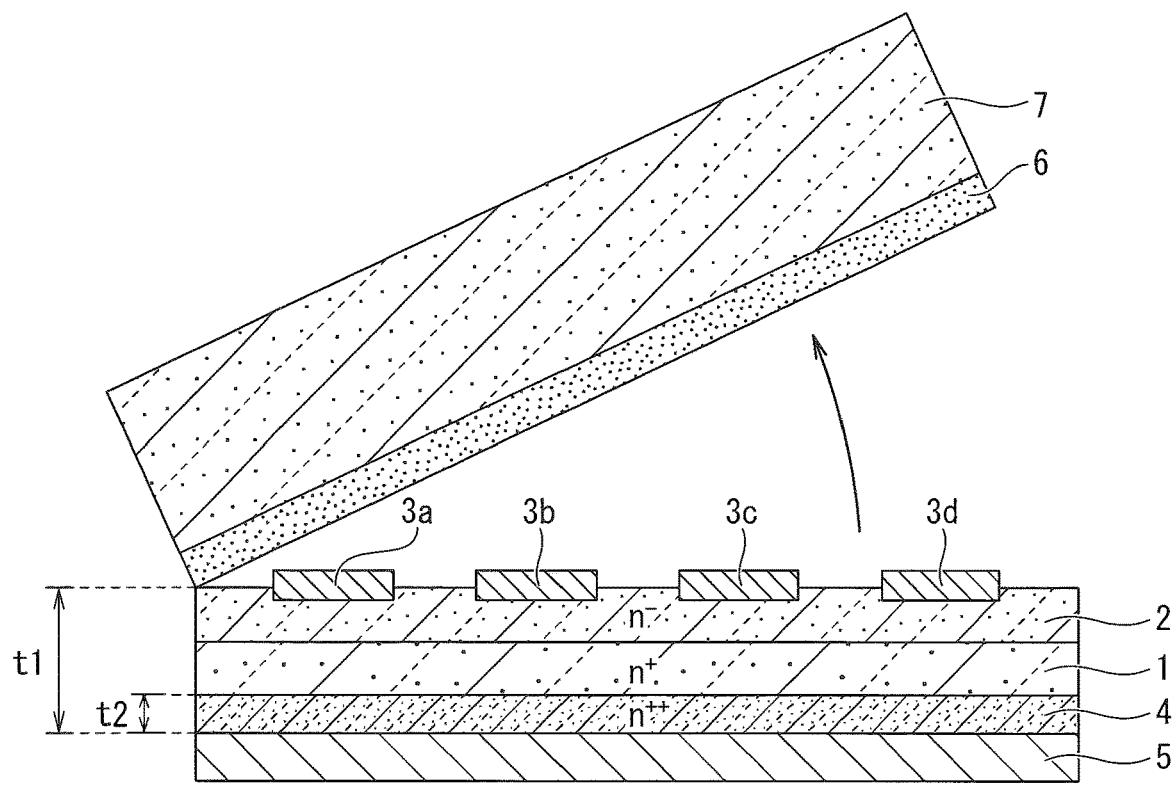
FIG. 11 is a schematic cross-sectional view illustrating the method for manufacturing the SiC semiconductor device according to a first embodiment (part 8)

Next, as illustrated in FIG. 11, adhesive force of the adhesive 6 is eliminated, for example, by heating, ultraviolet irradiation or the like, and the support plate 7 is peeled off from the upper surface of the first semiconductor layer 2. FIG. 11 is a schematic view illustrating the adhesive 6 peeled from the semiconductor device. Although not illustrated, a surface-shape of the adhesive 6 adhered to the semiconductor device has an uneven shape according to a surface-shape of the semiconductor device. Depending on a peeling method, the adhesive 6 and the support plate 7 may be separated. In such case, the adhesive 6 remaining on the device surface is removed by a known method such as cleaning. Hereinafter, the thin SBD element as illustrated in FIG. 1 can be obtained by executing predetermined processing, such as cleaning, forming a protective film and the like. Almost no precipitated carbon has been observed at an interface between the second semiconductor layer 4 and the metallic electrode film 5, which implement the ohmic-contact of the SBD element.

In the first embodiment, the process temperature is suppressed to a low temperature of the heatproof temperature of the organic adhesive 6 even at maximum during the manufacturing process from the formation of the device structures 3a to 3d on the top surface-side to the separation of the support plate 7. At the same time, the thickness t2 of the second semiconductor layer 4 is formed to control to be thin within a certain range. As the process is executed at a low temperature and the thickness t2 of the second semiconductor layer 4 is intentionally controlled to be thin, precipitation of carbon between the second semiconductor layer 4 and the metallic electrode film 5 is greatly prevented. In addition, even if carbon-atoms are precipitated, a thickness of a carbon-containing region may be suppressed to 10 nm or less.

In other words, in the first embodiment, the silicide layer is not intentionally formed between the second semiconductor layer 4 and the metallic electrode film 5. The silicidation reaction in the ohmic-contact is limited only to the silicidation reaction inevitably occurring in the interface due to metallurgical bonding of the second semiconductor layer 4 of SiC and the metallic electrode film 5. The thickness of the region of the silicide formed due to the silicidation reaction which inevitably occurs is substantially suppressed to 10 nm or less.

Comparative Example

Figure 12:
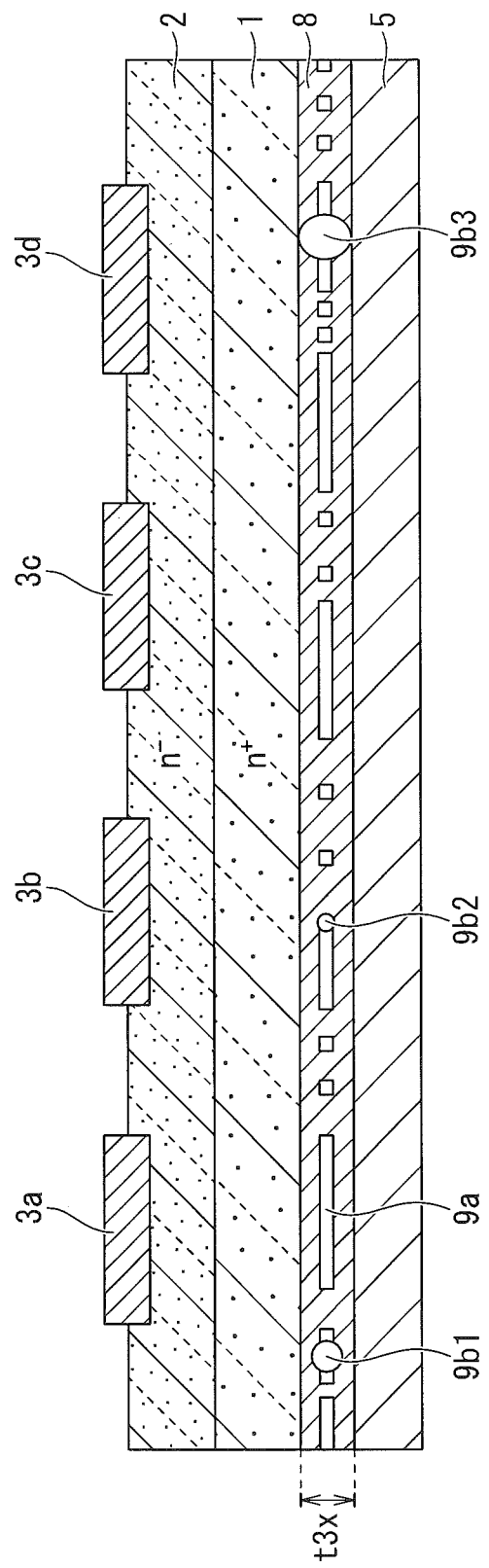
FIG. 12 is a schematic cross-sectional view illustrating a configuration of a SiC semiconductor device according to a comparative example.

On the other hand, in FIG. 12, a SiC semiconductor device in which the silicide layer is intentionally formed is illustrated as a comparative example. As in the case with the SiC semiconductor device illustrated in FIG. 1, the SiC semiconductor device according to the comparative example has a thin structure including the SBD as the device structures 3a to 3d on the top surface. In addition, the SiC semiconductor device according to the comparative example is different from the SiC semiconductor device illustrated in FIG. 1 in that, instead of the second semiconductor layer 4, which is the n-type layer having the high impurity concentration as illustrated in FIG. 1, the silicide layer 8 as an ohmic-contact layer is provided on the back surface of the semiconductor substrate 1.

In the silicide layer 8, the crystalline structure of SiC is greatly disturbed by the intentional silicidation reaction between the SiC and the metal, so that the contact resistance can be decreased due to many levels formed in the energy-barrier between the SiC and the metal. However, in the case of the comparative example, a thickness t3x of the silicide layer 8 as the ohmic-contact layer may not be controlled to be thin but, on the contrary, is formed as thick as about 100 nm, so that an amount of excess carbon-atoms precipitated by the silicidation reaction may largely increase. In the silicide layer 8 illustrated in FIG. 12, a carbon layer 9a, in which the excess carbon-atoms are precipitated in a layer with the silicidation reaction, and a plurality of carbon-clusters 9b1, 9b2, 9b3, in which the excess carbon-atoms are precipitated in bulks, are exemplified.

For the sake of comparison, a method of manufacturing the SiC semiconductor device according to the comparative example will be described. First, similarly to the steps illustrated in FIGS. 2 to 5, the n$^-$-type first semiconductor layer 2 is epitaxially grown on the previously prepared n$^+$-type semiconductor substrate 1a. After the device structures 3a to 3d are formed on the top surface-side of the first semiconductor layer 2, the back surface-side is thinned by polishing.

Figure 13:
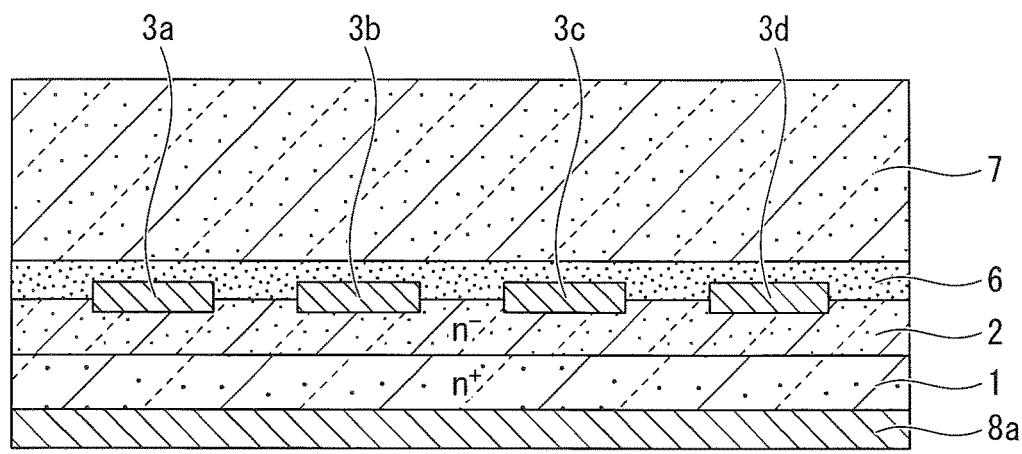
FIG. 13 is a schematic cross-sectional view illustrating a method for manufacturing the SiC semiconductor device according to the comparative example (part 1)

Next, as illustrated in FIG. 13, a metallic layer 8a is deposited on a lower surface of the thinned semiconductor substrate 1 to a thickness of about 60 nm or more by sputtering or the like. For the metallic layer 8a, a single-layer film, an alloy-layer film, a mixed-layer film and a laminated film, using any metal forming a silicide of Ni, Ti, molybdenum (Mo), Al or the like can be adopted.

Here, when the semiconductor layer has an impurity concentration of about $5 \times 10^{18}$ cm$^{-3}$ or less and a thickness of the silicide layer 8, bonded to the semiconductor layer, is thinner than about 100 nm, the resistance between the semiconductor layer and the silicide layer 8 may be largely increased, or the resistance value may be unstable. Therefore, in the comparative example, the thickness of the metallic layer 8a is increased to about 60 nm or more so that the silicidation reaction between the metal and SiC are sufficiently executed and the thickness t3x of the silicide layer 8 is increased.

Figure 14:
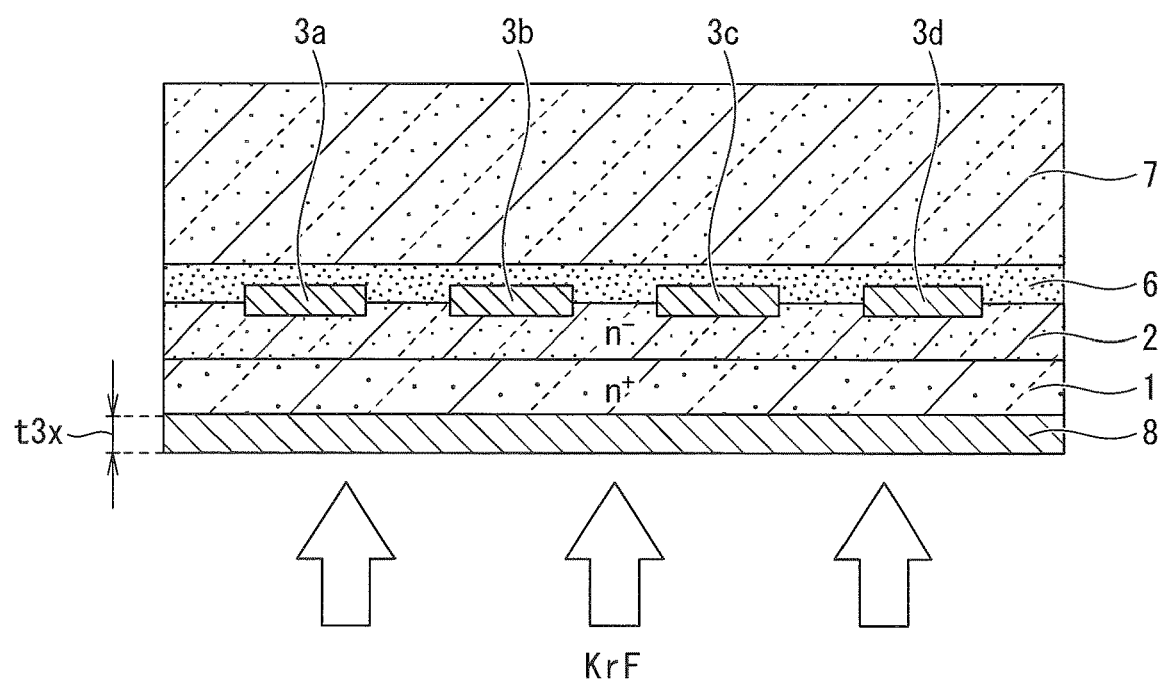
FIG. 14 is a schematic cross-sectional view illustrating the method for manufacturing the SiC semiconductor device according to the comparative example (part 2)
Figure 15:
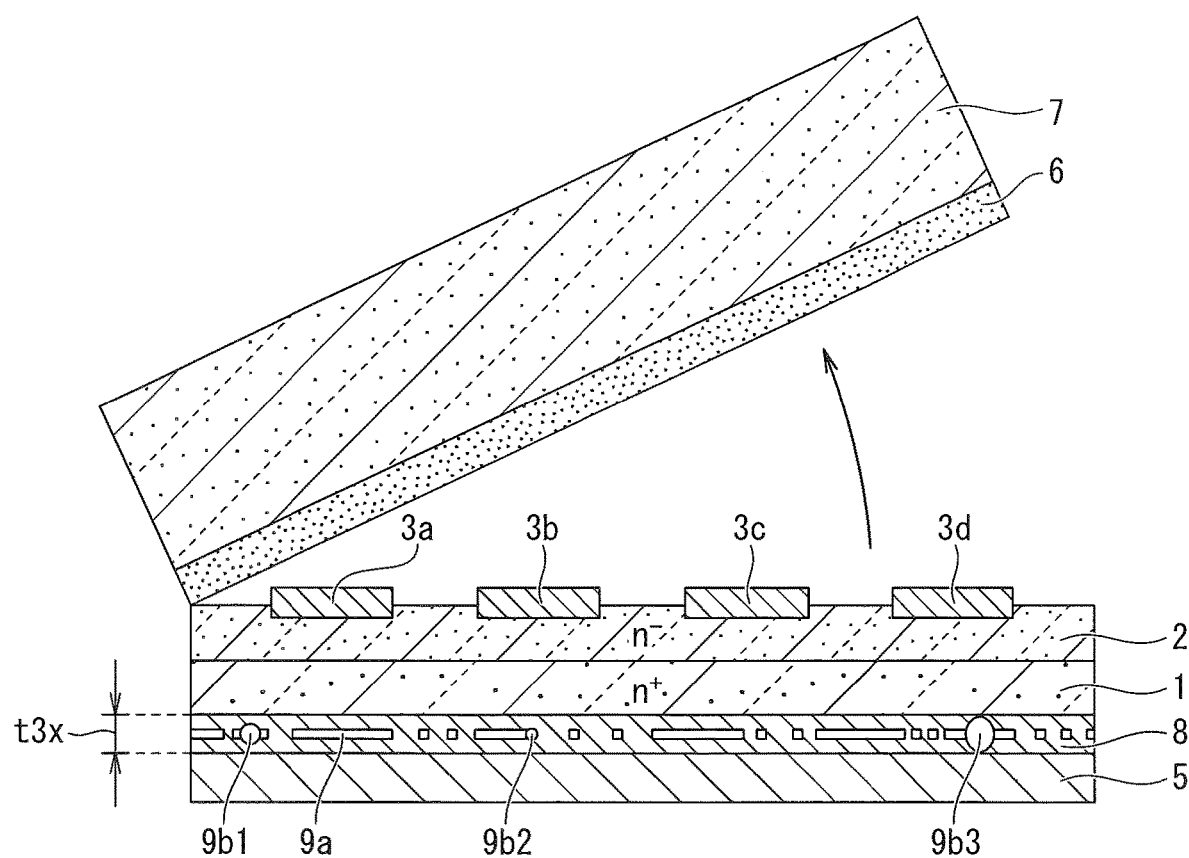
FIG. 15 is a schematic cross-sectional view illustrating the method for manufacturing the SiC semiconductor device according to the comparative example (part 3)

Next, as illustrated in FIG. 14, a local high-temperature annealing using a KrF excimer laser or the like is executed on the lower surface of the metallic layer 8a, so as to form the silicide layer 8 having a constant thickness t3x as an ohmic-contact layer. In the case of the silicidation reaction between a Ni layer having a thickness of about 60 nm and the SiC, the SiC in a region of the same depth as the Ni layer is consumed in the silicidation reaction, and the thickness t3x of the silicide layer 8 after the silicidation reaction increases to about 100 nm. It is noted that since an annealing temperature in the case of a high-temperature annealing, such as lamp annealing and the like, in which whole area is heated, exceeds the heatproof temperature of the organic adhesive used as the adhesive 6 for bonding the support plate 7, the local high-temperature annealing is executed.

Hereinafter, although illustration is omitted, a metallic electrode film 5 is deposited on the silicide layer 8 by sputtering as a back electrode, as in the case of the first embodiment, the adhesive 6 is removed so as to peel the support plate 7, thereby forming the SBD element according to the comparative example. In the SBD element thus obtained, as illustrated in FIG. 12, the carbon layer 9a and the carbon-clusters 9b1 to 9b3 have been generated inside the silicide layer 8 in a large thickness of 10 nm or more.

In the method of manufacturing the SiC semiconductor device according to the comparative example, since the thickness t3x of the silicide layer 8 increases too much, the amount of precipitated carbon-atoms significantly increases. Further, the carbon-atoms aggregate not only on the upper surface-side of the silicide layer 8 but also in the silicide layer 8, and precipitate in a layer or a cluster. Further, the amount of the excess carbon-atoms which can not be released to a surface of the silicide layer 8, corresponding to the lower surface in FIG. 14, opposite to the reaction position, may increase. The carbon-atoms that could not be released to the surface may be precipitated and accumulated inside the silicide layer 8, so as to cause a failure of the SiC semiconductor device.

On the other hand, in the method of manufacturing the SiC semiconductor device according to the first embodiment, the silicide layer 8 is not intentionally formed. Then, by controlling the impurity concentration and the thickness t2 of the second semiconductor layer 4 serving for the ohmic-contact, the precipitation of carbon-atoms is prevented so that almost no carbon is present in the interface between the second semiconductor layer 4 and the metallic electrode film 5. Therefore, it is possible to prevent initial electrode peeling, and occurrence of voids or peeling due to thermal stress applied by continuous energization for a long time or discontinuous energization, which are caused by the precipitated carbon-atoms, and a high quality SiC semiconductor device having stable ohmic-contact can be manufactured.

Moreover, in the method of manufacturing the SiC semiconductor device according to the first embodiment, the ohmic-contact provided on the back surface of the semiconductor device is formed by the low-temperature process of about 200° C. or less. By the low-temperature process, the amount of carbon precipitated between the second semiconductor layer 4 and the metallic electrode film 5 is further prevented. Further, even if the device structures 3a to 3d are present on the top surface-side, the influence on the device structures 3a to 3d, such as heat applied during the formation of the ohmic-contact on the back surface side can be prevented. Therefore, the reliability of the semiconductor device can be further improved.

Further, in the method of manufacturing the SiC semiconductor device according to the first embodiment, since the thickness from the upper surface of the first semiconductor layer 2 to the lower surface of the second semiconductor layer 4 is reduced to 50 μm or less, a SiC power semiconductor device having a thin and vertical structure in which an on-resistance is reduced can be manufactured. Further, since thinning processing is carried out by increasing the strength during processing by bonding the support plate 7, breakage of the semiconductor device during processing can be prevented.

Here, as an example of a method for reducing the energy barrier between SiC and a metal, a method of forming an ohmic-contact layer having a high impurity concentration and low resistance, in which impurity ions with a high concentration are implanted into a SiC semiconductor substrate in a high-temperature and the implanted ions are activated, is known. However, when high-dose ion implantation of, for example, about $10^{15}/cm^2$ is executed on a (0001) plane, or (000-1) plane, of 4H—SiC, it is necessary to preliminarily heat the semiconductor substrate to 300° C. to 800° C. In the absence of a preliminary heat treatment, recrystallization of 4H—SiC and activation of impurity ions are not effectively carried out. Therefore, in the method of implanting the impurity ions at high concentration into the SiC semiconductor substrate in high temperature, it is impossible to use an organic adhesive as the adhesive 6.

On the contrary, in the method of manufacturing the SiC semiconductor device according to the first embodiment, since the ion implantation after bonding of the support plate 7 is executed in a low temperature, a wide range of organic adhesives having a relatively low heatproof temperature can be selected. The organic adhesives are inexpensively available and easy to handle. Since it is unnecessary to execute a high temperature annealing in a range of about 1,600° C. to 1,800° C. for activating a SiC implanted region after the ion implantation, lack of Si from the surface of the SiC semiconductor device, or surface roughening due to migration does not occur. Further, since melting of Ni or the like which is frequently used as an electrode material, is prevented, the manufacturing method according to the first embodiment has advantage for maintaining the stability of the device structures 3a to 3d.

In the method of manufacturing the SiC semiconductor device according to the first embodiment, by implanting N ions with the low temperature of the SiC semiconductor device as about 200° C. or less, without using P ions, the ion-implantation region 4a, which scheduled to be the second semiconductor layer 4, is fabricated. Therefore, generation of crystal defects due to implantation damage can be prevented.

Further, in the method of manufacturing the SiC semiconductor device according to the first embodiment, in consideration of the correlation between the impurity concentration and the contact resistance in the ion implantation, the concentration of the implanted impurity ions is controlled in a range of $5 \times 10^{18}$ cm$^{-3}$ or more and $5 \times 10^{19}$ cm$^{-3}$ or less. Therefore, the contact resistance can be effectively decreased.

Activation of the ion-implantation region 4a is not executed by heating the entire semiconductor device with the lamp annealing, but by heating with the local laser light irradiation. Therefore, deterioration in the characteristics of the device structures 3a to 3d can be prevented by thermal conduction of the heat generated in the activation of the ion implantation region 4a on the back surface-side to the top surface-side. The effectiveness of preventing the deterioration in the characteristics of the device structures 3a to 3d due to the thermal conduction is available particularly in the manufacture of the SiC semiconductor device for decreasing the on-resistance by reducing the thickness of the semiconductor device.

The wavelength of the laser light used for activating the ion-implantation region 4a is set to 190 nm or more and 388 nm or less in consideration of the penetration depth into the SiC semiconductor layer. Therefore, it is advantageous in manufacturing the SiC semiconductor device for reducing the on-resistance by thinning the thickness of the SiC semiconductor device.

<Modification of First Embodiment—First Modification Example—>

Figure 16:
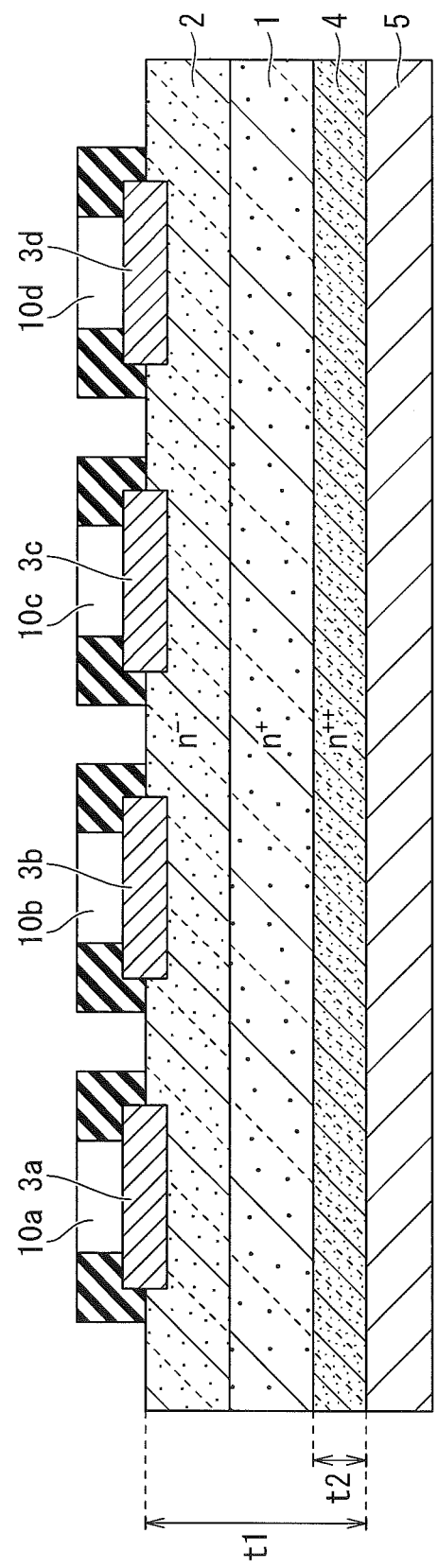
FIG. 16 is a schematic cross-sectional view illustrating a method for manufacturing a SiC semiconductor device according to a modification (first modification) of the first embodiment.

In a manufacturing method of the SiC semiconductor device according to a modification of the first embodiment, or a first modification, as illustrated in FIG. 16, protective films 10a, 10b, 10c, 10d for protecting the device structures 3a to 3d are disposed on the respective device structures 3a to 3d may be included. The protective films 10a to 10d illustrated in FIG. 16 are in frame-shapes having rectangular outer-edges in a planar pattern of the principal surface of the SiC semiconductor device viewed from the front, and openings in the inner sides of the frames are used as contact regions.

As the method of manufacturing the SiC semiconductor device according to the first modification, first, similarly to the steps illustrated in FIGS. 2 and 3, an n⁻-type first semiconductor layer 2 is grown on a prepared n⁺-type semiconductor substrate 1a, and the device structures 3a to 3d are formed on the top surface-side of the first semiconductor layer 2. Then, the protective films 10a to 10d are laminated on the peripheral portions of the device structures 3a to 3d so that the frames of the protective films 10a to 10d overlap to the device structures 3a to 3d, respectively. The protective films 10a to 10d may be fabricated by a photolithography technique and an etching technique.

For a material of each of the protective films 10a to 10d, an insulating resin structure using an organic material in which a thermal decomposition temperature, or a heat resistance, is relatively low, may be used depending on the maximum temperature in the back surface processing. Specifically, a thermosetting plastic material, such as a polyimide-based resin having the thermal decomposition temperature of about 300° C. to about 400° C., or a phenolic resin having the thermal decomposition temperature of about 150° C., may be adopted as long as the thermal decomposition temperature does not exceed the maximum temperature in the back surface processing.

In particular, the polyimide-based resin is preferable, because the polyimide-based resin has a relatively high thermal decomposition temperature, excellent insulating properties and low linear expansion coefficients, and is compatible with a metal wiring. In addition, for the protective films 10a to 10d, any organic material other than a thermosetting plastic material and the like may be adopted, as long as the thermal decomposition temperature of the organic material is lower than the maximum process temperature in the back surface processing. The shapes of the protective films 10a to 10d may be appropriately adopted, and are not limited to the shapes illustrated in FIG. 16. Since the back surface processing, for example, the back surface processing of the second semiconductor layer 4 is executed in a low temperature of about 200° C. or lower, even a material having low heat resistance such as a resin, may be used in the manufacturing processes of the device structures 3a to 3d on the top surface side.

By executing the equivalent processes illustrated in FIGS. 4 to 11 after forming the protective films 10a to 10d, a thin SiC vertical power SBD element similar to that in the first embodiment may be achieved. Since the manufacturing method of the SiC semiconductor device according to the first modification is the same as the manufacturing method of the SiC semiconductor device according to the first embodiment except that the protective films 10a to 10d are provided, the redundant description will be omitted.

In the manufacturing method of the SiC semiconductor device according to the first modification, since the protection structures of the device structures 3a to 3d is provided using the organic material having a relatively low thermal decomposition temperature, it is possible to further improve the quality of the SiC semiconductor device. Other effectiveness of the method of manufacturing the SiC semiconductor device according to the first modification may be the same as the manufacturing method of the SiC semiconductor device described with reference to FIGS. 1 to 11.

Second Embodiment

<Semiconductor Device>

Figure 17:
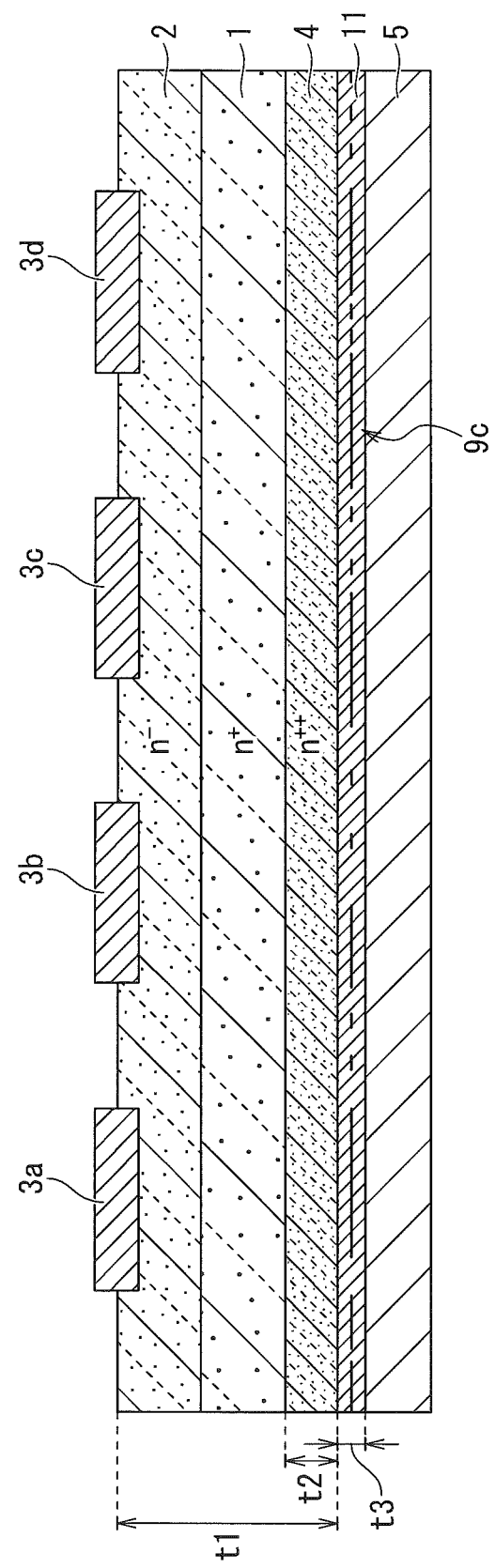
FIG. 17 is a schematic cross-sectional view illustrating a configuration of a SiC semiconductor device according to a second embodiment of the present invention.

As illustrated in FIG. 17, a SiC semiconductor device according to a second embodiment is different from the SiC semiconductor device according to the first embodiment in that a silicide layer 11 having a thickness t3 controlled to 20 nm or less is provided between the second semiconductor layer 4 and the metallic electrode film 5. In addition, the silicide layer 8 having a thickness t3x of about 100 nm has also been described in the SiC semiconductor device according to the comparative example illustrated in FIG. 12. In the silicide layer 8 of the SiC semiconductor device according to the comparative example, while avoiding increase in resistance or instability of resistance value, the silicidation reaction has been driven without controlling the degree, so that the amount of carbon-atoms precipitated in the ohmic-contact has increased. However, in the SiC semiconductor device according to the second embodiment, the degree of silicidation reaction is controlled such that the amount of carbon-atoms is decreased while avoiding increase in resistance or instability of resistance value, and thus, the thickness t3 of the silicide layer 11 is made thinner than the thickness t3x in the case of the comparative example.

The SiC semiconductor device according to the second embodiment, as in the first embodiment, includes the SiC n⁺-type semiconductor substrate 1 and the SiC n⁻-type first semiconductor layer 2 provided on the semiconductor substrate 1. The device structures 3a to 3d are provided on the first semiconductor layer 2 and the n⁺⁺-type SiC second semiconductor layer 4 is provided below the first semiconductor layer 2 so as to be jointed to the lower surface of the semiconductor substrate 1. The metallic electrode film 5 is provided under the second semiconductor layer 4 so as to be jointed to the lower surface of the silicide layer 11. The junction between the second semiconductor layer 4 and the silicide layer 11 implements the ohmic-contact in the second embodiment.

The thickness t2 of the second semiconductor layer 4 is controlled to be 0.05 μm or more and 0.5 μm or less and the thickness t3 of the silicide layer 11 is extremely thin as 20 nm or less so that the thickness of the carbon-containing region 9c is controlled to be 10 nm or less. In FIG. 17, the carbon-containing region 9c is exemplified by a partially broken horizontal line. The constituents other than the silicide layer 11 in the SiC semiconductor device according to the second embodiment is equivalent to the members having the same name in the first embodiment, and thus the redundant description will be omitted.

In the SiC semiconductor device according to the second embodiment, as in the case of the first embodiment, the thickness t2 of the second semiconductor layer 4 and the thickness t3 of the silicide layer 11 are each controlled so as to be thinner or less than a degree of predetermined value. Therefore, precipitation of carbon-atoms in the ohmic-contact can be reliably decreased. The other effectiveness of the SiC semiconductor device according to the second embodiment may be the same as the first embodiment. In addition, when the SiC semiconductor device is additionally subjected to a heat treatment such as sintering and the like, the upper limit value of the thickness t3 of the silicide layer 11 is not limited to 20 nm and may be increased to about 30 nm.

<Manufacturing Method of Semiconductor Device>

Next, a manufacturing method of the SiC semiconductor device according to the second embodiment will be described. First, as in the steps illustrated in FIGS. 2 to 8, the n⁻-type SiC first semiconductor layer 2 is epitaxially grown on the prepared n⁻-type semiconductor substrate 1a. Then, after forming the device structures 3a to 3d on the top surface side of the first semiconductor layer 2, the back surface side is polished and thinned to form the n⁺⁺-type SiC second semiconductor layer 4 below the semiconductor substrate 1.

In addition, the correlation between the impurity concentration and the contact resistance exemplified in FIG. 7, may be also effective when the silicide layer 11 is formed by activating the metallic layer 11a of Ni deposited on the lower surface of the second semiconductor layer 4. Therefore, in consideration of the correlation illustrated in FIG. 7, also in the second embodiment, the impurity concentration of the implanted ions is controlled to about $5 \times 10^{18}$ cm$^{-3}$ or more and about $5 \times 10^{19}$ cm$^{-3}$ or less.

Figure 18:
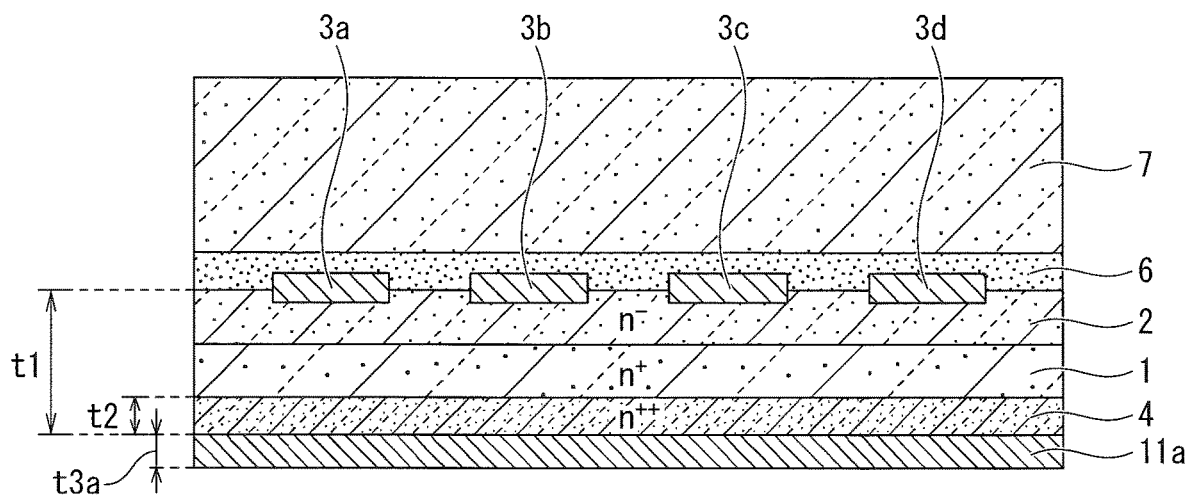
FIG. 18 is a schematic cross-sectional view illustrating a method for manufacturing the SiC semiconductor device according to the second embodiment (part 1)

Next, as illustrated in FIG. 18, a metallic layer 11a is deposited on the lower surface of the second semiconductor layer 4 in the back surface side by a sputtering technique and the like, and silicidation reaction between the metallic layer 11a and SiC in the lower part of the semiconductor substrate 1 is driven by executing high-temperature annealing. The silicidation of the metallic layer 11a can be executed, for example, using a contact annealing by a rapid thermal annealing (RTA) and the like. For the metallic layer 11a, a single-layer film of metal for silicidation containing at least one of silver (Ag), platinum (Pt), Ni, Ti, Mo, Al and the like, or an alloy-layer film, a mixed-layer film and a laminated film using any metals of Ni, Ti, molybdenum (Mo), Al or the like may be adopted. In particular, the metal, such as Ni, Ti, Mo and Al, may be suitably adopted due to low cost for silicidation.

Here, since it is necessary to thin the silicide layer 11 as illustrated in FIG. 17 in order to effectively prevent the deposition of carbon, the thickness t3a of the metallic layer 11a, scheduled to be the silicide layer 11, is 3 nm or more, is desirably 10 nm or less, and more desirable 5 nm or more and 7 nm or less. If the thickness t3a is thinner than 3 nm, it is difficult to secure a sufficient amount of heat for heating of silicidation. If the thickness t3a is more than 10 nm, it is difficult to suppress the thickness t3 of the silicide layer 11 obtained by annealing the metallic layer 11a to 20 nm or less.

Even if the metallic layer 11a is thin, N ions are implanted so as to form the box-profile of about $3 \times 10^{19}$ cm$^{-3}$ as in the case of the first embodiment, and to achieve the second semiconductor layer 4 at a high impurity concentration. Therefore, the contact resistance between the metallic layer 11a and the second semiconductor layer 4 can be made sufficiently small.

It is desirable for the metallic layer 11a to include a metal for forming carbide in the form of a single substance or a complex. Since the metal forming the carbide is included, the excess carbon-atoms are driven to precipitate on the top surface side of the silicide layer 11 without remaining in the silicide layer 11 in layers. Further, the thickness of the region of carbon-atoms precipitated on the top surface side of the silicide layer 11 may be decreased to about 10 nm or less. The carbon-atoms precipitated on the top surface side of the silicide layer 11 may be easily removed by a known method such as etching and the like.

Figure 19:
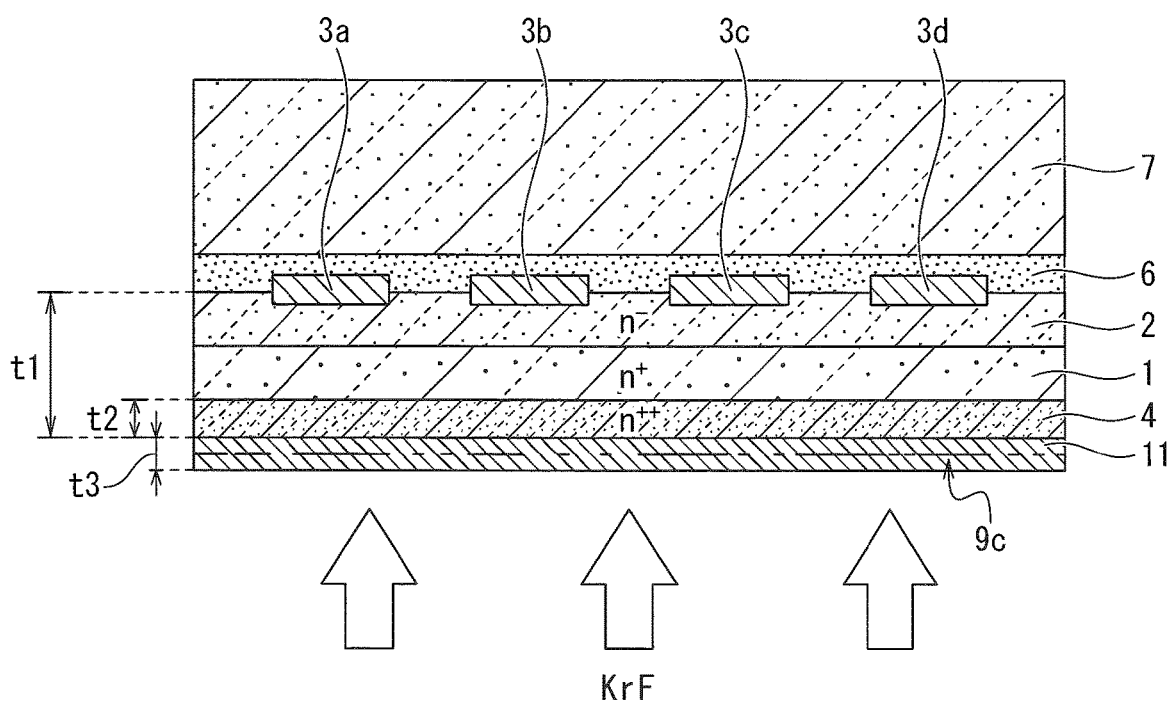
FIG. 19 is a schematic cross-sectional view illustrating a method for manufacturing the SiC semiconductor device according to the second embodiment (part 2)

Then, as illustrated in FIG. 19, local high-temperature annealing using a laser light, such as KrF or the like, is executed on the lower surface of the metallic layer 11a, and the metallic layer 11a is heated so as to suppress the spread of heat toward the device structures 3a to 3d. The silicide layer 11 implementing the ohmic-contact layer is formed with the thickness t3 decreased to 20 nm or less by heating the metallic layer 11a. Since the thickness t3a of the metallic layer 11a to be irradiated is small, the energy of the laser light required for irradiation can be reduced. Therefore, since excessive laser light irradiation is prevented, thermal damage applied to the semiconductor substrate 1 by laser light irradiation can be reduced.

Next, as in the processes illustrated in FIGS. 10 to 11, the metallic electrode film 5 is formed as the back electrode on the silicide layer 11 by a sputtering technique and the like. Then, by removing the adhesive 6 on the top surface side so as to peel off the support plate 7, the thin SiC vertical power SBD element is obtained as the SiC semiconductor device.

In the manufacturing method of the SiC semiconductor device according to the second embodiment, as in the case of the first embodiment, a high quality SiC semiconductor device, in which precipitation of carbon-atoms in the ohmic-contact is largely decreased, can be achieved. The other effects of the manufacturing method of the SiC semiconductor device according to the second embodiment are the same as those of the first embodiment. In addition, the manufacturing method of the SiC semiconductor device according to the second embodiment is not limited to the above-mentioned descriptions, and by appropriately changing the thickness and concentration of the SiC semiconductor substrate 1 and the second semiconductor layer 4, it is also possible to further reduce the contact resistance.

<Modification of Second Embodiment—Second Modification—>

In a manufacturing method of the SiC semiconductor device according to a modification of the second embodiment, or a second modification, a silicide layer implementing the ohmic-contact is formed by executing a plasma treatment for selectively heating the metallic layer in a hydrogen plasma atmosphere. In the second modification, the spread of heat toward the device structures 3a to 3d side may be suppressed using heating the metallic layer by plasma treatment.

In the manufacturing method of the SiC semiconductor device according to the second modification, similarly to the processes illustrated in FIGS. 2 to 8, after forming the device structures 3a to 3d on the top surface side of the n⁻-type first semiconductor layer 2, which is epitaxially grown on the prepared n-type semiconductor substrate 1a, the back surface side is polished and thinned. Then, the n⁺⁺-type second semiconductor layer 4 is formed below the semiconductor substrate 1.

Next, as similarly in FIG. 18, a metallic layer (refer to the metallic layer 11a in FIG. 18) is deposited on the lower surface of the second semiconductor layer 4 in the back side by a sputtering technique and the like. As a metal adopted for the metallic layer used in the second modification, not only silicidation but also reactivity with hydrogen plasma may be considered. Specifically, a single layer film containing at least one of transition metals, such as Ni, Ti, tungsten (W), Mo, tantalum (Ta) and the like, and Ag, or an alloy-layer film containing one or more of transition metals and Ag as a main component is preferable. The transition metal is a metal element listed between Group 3 element and Group 11 element in the periodic table of elements.

In particular, for the metallic layer, the single layer film of the transition metal, such as Ni, Ti, Ta or W, or the alloy-layer film containing one or more transition metals as a main component is more preferable. The metals, such as Ni, Ti, Ta and W, are advantageous from the viewpoint of high practicality because material costs are lower than other metals and the ohmic-contact with a semiconductor layer is easily formed.

Figure 20:
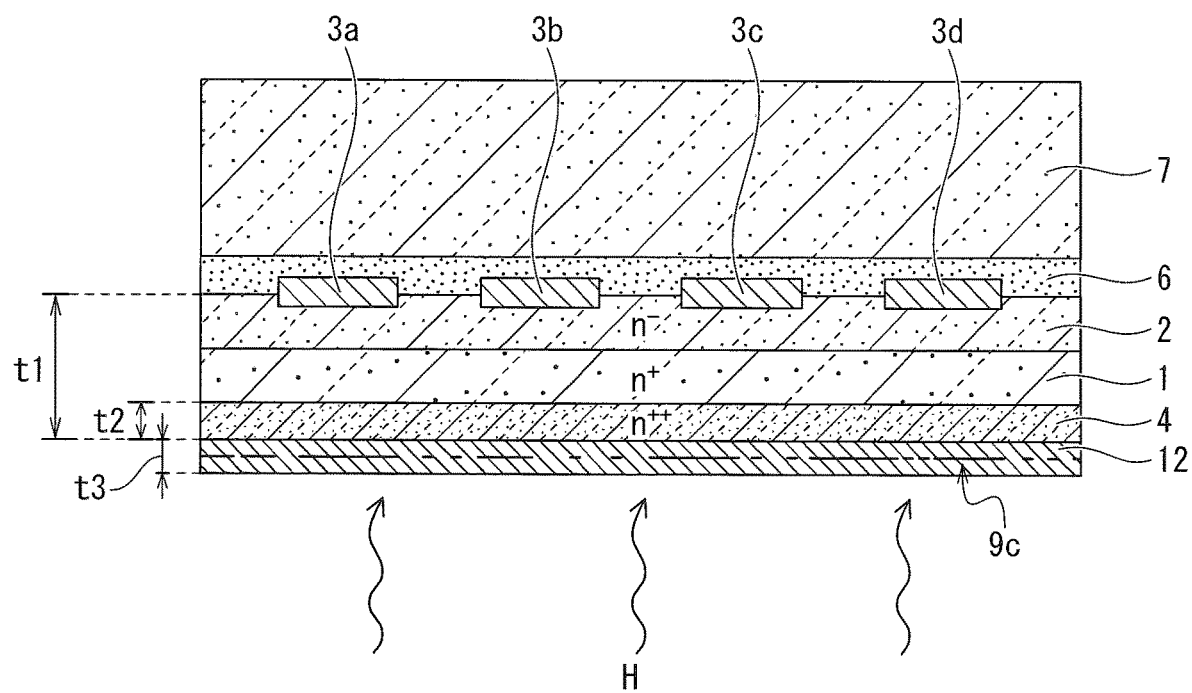
FIG. 20 is a schematic cross-sectional view illustrating a method for manufacturing a SiC semiconductor device according to a modification (second modification) of the second embodiment.

Next, as illustrated in FIG. 20, the semiconductor substrate 1 having the metallic layer at the lower part is placed into the chamber in which the hydrogen plasma atmosphere is provided, and exposed to the hydrogen plasma atmosphere generated by microwave, and thus, the metallic layer is heated. In a process of the plasma processing, as the microwave for generating the hydrogen plasma atmosphere, a specification of a frequency of about 2.45 GHz and a power of about 1 kW is suitable. In addition, when hydrogen is adjusted to supply in the chamber at about 10 Pa or more and about 100 Pa or less, quality of the formed ohmic-contact can be further improved.

Hydrogen radicals generated from hydrogen atoms that gained energy in the plasma, release thermal energy when the Hydrogen radicals become hydrogen molecules on the lower surface of the silicide metal layer 12 a. Hydrogen atoms that gained energy in the plasma become hydrogen radicals and release thermal energy when they become hydrogen molecules on the lower surface of the metallic layer. The portion of the second semiconductor layer 4 in contact with the metallic layer is heated by the released thermal energy and the metallic layer and the second semiconductor layer 4 may react. By the reaction of the metallic layer and the second semiconductor layer 4, a silicide layer 12 serving as the ohmic-contact layer is formed and controlled at the interface between the metallic layer and the second semiconductor layer 4 having the thickness t3 of 20 nm or less.

Next, as in the processes illustrated FIGS. 10 to 11, the metallic electrode film 5 is formed as a back electrode on the silicide layer 12 by a sputtering technique and the like. Then, by removing the adhesive 6 on the top surface side so as to peel off the support plate 7, the thin SiC vertical power SBD element is obtained as a SiC semiconductor device.

The effectiveness of the manufacturing method of the SiC semiconductor device according to the second modification is the same as the case of the manufacturing method of the SiC semiconductor device according to the second embodiment illustrated in FIGS. 17 to 19. In the process of the plasma processing according to the second modification, since the metallic layer is selectively heated, a pattern may be delineated on the silicide layer 12 as needed, by forming the pattern on the metallic layer. The versatility of the SiC semiconductor device can be enhanced by the patterned silicide layer 12.

Third Embodiment

Figure 21:
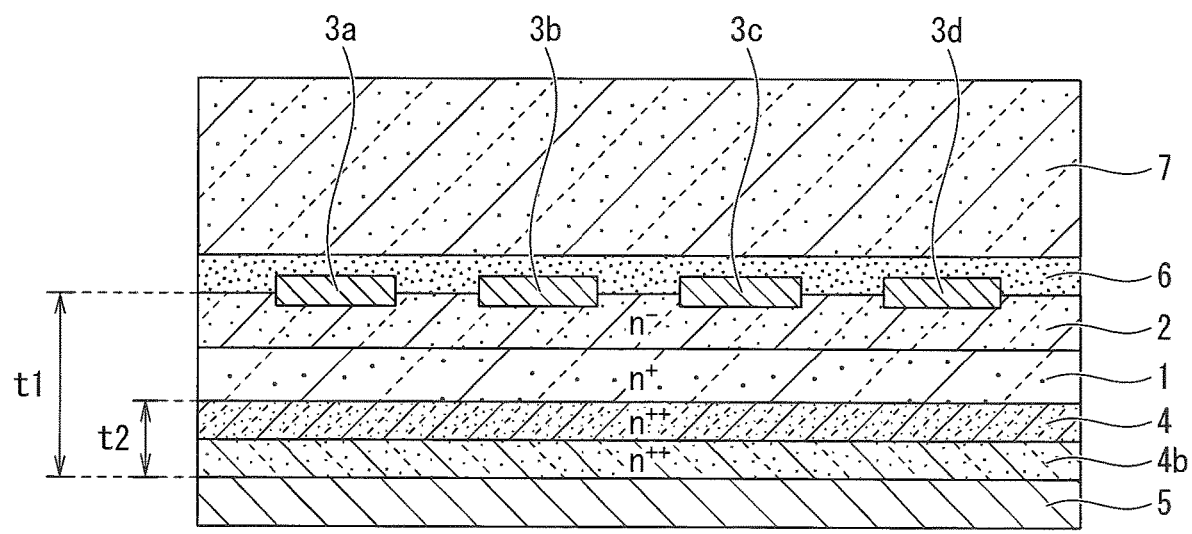
FIG. 21 is a schematic cross-sectional view illustrating a configuration of a SiC semiconductor device according to a third embodiment.

A SiC semiconductor device according to a third embodiment, as illustrated in FIG. 21, is different from the SiC semiconductor device according to the first embodiment in that a surface of the second semiconductor layer 4 in the metal electrode film 5 side is a polycrystallization region 4b. Thus, since the surface of the lower part of the SiC semiconductor device includes a boundary between the polycrystal and the single crystal and becomes uneven, adhesion with an electrode layer to be formed later can be improved. In addition, a silicide layer may be further provided between the polycrystallization region 4b of the second semiconductor layer 4 and the metallic electrode film 5.

As a manufacturing method of the polycrystallization region 4b, in the process of the ion implantation, illustrated in FIG. 6, of the SiC semiconductor device according to the first embodiment, ions having an amount exceeding the solid solubility limit of the SiC semiconductor may be implanted into the outermost surface of the semiconductor substrate 1. By implanting the excess ions, it is possible to form the polycrystallization region 4b of the second semiconductor layer on the back surface of the semiconductor substrate 1 simultaneously with the second semiconductor layer 4. The solubility limit for SiC crystal is, for example, about $5 \times 10^{19}$ $cm^{-3}$ in the case of N and about $5 \times 10^{20}$ $cm^{-3}$ in case of P.

Other Embodiments

While the present invention has been described by the above disclosed embodiments, it should not be understood that the description and drawings constituting a part of this disclosure limit the present invention. From this disclosure, it should be considered that various alternative embodiments, examples and operational techniques will be apparent to those skilled in the art. For example, in the first to third embodiments, the case where the SBD is used as the device structures 3a to 3d has been described, but the present invention is not limited to the SBD, and there is no difference in effect even with other device structures of MOS structure, such as IGBT, MOSFET and the like.

In the first to third embodiments, the second semiconductor layer having high concentration, which forms the ohmic-contact, is n-type, but the conductivity type of the second semiconductor layer is not limited to n-type, and in the present invention, p-type may be used. For p-type impurity ions, Al, boron (B), beryllium (Be) or the like can be used individually or in combination, and can be adopted for ion implantation at low temperature. For example, when Al and Be are combined, since the diffusion coefficient of Be is larger than that of Al, it is easy to form a high concentration p-type ion implantation region having a desired thickness and width. Then, by activating ions while adjusting the activation depth of the ion implantation region, it is possible to manufacture a SiC semiconductor device such as an IGBT having a p-type collector layer with a predetermined concentration and thickness on the back side, and the amount of excess carbon-atoms precipitated in the backside ohmic-contact can be suppressed.

Also, as described in the comparative example and the second embodiment, it is possible to disturb the crystalline state of SiC by providing a silicide layer. However, disturbance of the crystalline state of SiC can be also achieved by physical impact to SiC. In addition, the method of applying physical impact to SiC may be combined with the semiconductor layer having a high concentration and the silicide layer implementing the ohmic-contact, and it is possible to achieve the SiC semiconductor device having the ohmic-contact of higher quality.

Further, the present invention may be implemented by combining the respective structures illustrated in FIGS. 1 to 21. The present invention is as above, the containing form or the like of the various embodiments which are not described above, the technical scope of the present invention is defined only by the inventive specified matters according to the scope of claims reasonable from the above description.

What is claimed is:

1. A silicon carbide semiconductor device comprising:
a first semiconductor layer of silicon carbide;
a device structure provided on top of the first semiconductor layer;
a second semiconductor layer of silicon carbide having a higher impurity concentration than the first semiconductor layer, provided below the first semiconductor layer, the second semiconductor layer implementing an ohmic-contact;
a silicide layer, formed by a silicidation reaction between a metallic layer and only the second semiconductor layer, having a thickness of 20 nm or less, provided below the second semiconductor layer; and
a metallic electrode film provided below the silicide layer; wherein
a thickness of a carbon-containing region in which carbon-atoms are amorphously disposed inside the silicide layer is 10 nm or less and greater than zero nm, and is less than the thickness of the silicide layer.

2. The silicon carbide semiconductor device according to claim 1, wherein a thickness of the second semiconductor layer is 0.05 μm or more and 0.5 μm or less.

3. The silicon carbide semiconductor device according to claim 1, wherein a dopant of the second semiconductor layer is nitrogen.

4. The silicon carbide semiconductor device according to claim 3, wherein an impurity concentration of the dopant is $5\times10^{18}$ cm$^{-3}$ or more and $5\times10^{19}$ cm$^{-3}$ or less.

5. The silicon carbide semiconductor device according to claim 1, wherein a polycrystallization region of the second semiconductor layer is present on a surface of the second semiconductor layer in the metal electrode film side.

6. The silicon carbide semiconductor device according to claim 1, wherein a thickness between an upper surface of the first semiconductor layer and a lower surface of the second semiconductor layer is 50 μm or less.

7. A method for manufacturing a silicon carbide semiconductor device comprising:
growing a first semiconductor layer on a silicon carbide semiconductor substrate;
forming a device structure on top of the first semiconductor layer;
thinning the semiconductor substrate;
implanting ions of an impurity element to a lower surface of the semiconductor substrate exposed by thinning;
activating the ions so as to form a second semiconductor layer of silicon carbide having a higher impurity concentration than the first semiconductor layer, the second semiconductor layer implementing an ohmic-contact and being provided below the first semiconductor layer;
depositing a metallic layer on the second semiconductor layer;
annealing the metallic layer to execute a silicidation reaction between the metallic layer and only the second semiconductor layer, so as to form a silicide layer having a thickness of 20 nm or less; and
forming a metallic electrode film on the silicide layer; wherein
a thickness of a carbon-containing region in which carbon-atoms are amorphously disposed inside the silicide layer is 10 nm or less and greater than zero nm, and is less than the thickness of the silicide layer.

8. The method according to claim 7, wherein the ions are implanted into the semiconductor substrate at an amount exceeding a solid solubility limit of the semiconductor substrate.

9. The method according to claim 7, wherein the thinning the semiconductor substrate is executed so that a thickness between an upper surface of the first semiconductor layer and a lower surface of the second semiconductor layer is 50 μm or less.

10. The method according to claim 7, wherein
the implanting the ions includes controlling a temperature of the silicon carbide semiconductor device at 200° C. or lower, and
nitrogen is used as an impurity element of the ions.

11. The method according to claim 10, wherein an impurity concentration of the nitrogen ions is $5\times10^{18}$ cm$^{-3}$ or more and $5\times10^{19}$ cm$^{-3}$ or less.

12. The method according to claim 7, wherein the activating the ions is executed by irradiating a laser light to the lower surface into which the ions are implanted.

13. The method according to claim 12, wherein a wavelength of the laser light is 190 nm or more and 388 nm or less.

14. The method according to claim 7, further comprising:
disposing a protective film on the device structure before the thinning the semiconductor substrate, the protective film including an organic material having a thermal decomposition temperature lower than a maximum temperature in a manufacturing process; wherein
the thinning the semiconductor substrate is executed in a state where the protective film is disposed on the device structure.

15. The method according to claim 7, wherein the annealing the metallic layer is executed by laser annealing.

16. The method according to claim 7, wherein the annealing the metallic layer is executed by a thermal energy released by hydrogen radicals in a hydrogen plasma atmosphere.

17. The silicon carbide semiconductor device according to claim 1, wherein an upper surface of the metallic electrode film is in contact with a lower surface of the silicide layer.

18. The silicon carbide semiconductor device according to claim 1, wherein
a dopant of the second semiconductor layer is nitrogen, and
an ion-implantation concentration of the nitrogen into the second semiconductor layer from a lower surface of the second semiconductor layer to a depth of 200 nm is in a uniform box-profile of $3\times10^{19}$ cm$^{-3}$.

19. The silicon carbide semiconductor device according to claim 1, further comprising a third semiconductor layer of silicon carbide having an impurity concentration lower than the second semiconductor layer and higher than the first semiconductor layer, provided between the first semiconductor layer and the second semiconductor layer.

* * * * *